United States Patent
Chung et al.

(10) Patent No.: US 11,362,309 B2
(45) Date of Patent: Jun. 14, 2022

(54) DISPLAY DEVICE INCLUDING A FILLING PATTERN

(71) Applicant: Samsung Display Co., Ltd., Yongin-si (KR)

(72) Inventors: Yun Ah Chung, Seoul (KR); Yo Han Kim, Seoul (KR); Jong Woo Kim, Hwaseong-si (KR); Jong Jin Park, Cheonan-si (KR); Byoung Duk Lee, Seongnam-si (KR); Yoon Hyeung Cho, Yongin-si (KR); Young Cheol Joo, Hwaseong-si (KR); Jae Heung Ha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 117 days.

(21) Appl. No.: 16/773,591

(22) Filed: Jan. 27, 2020

(65) Prior Publication Data
US 2020/0251688 A1    Aug. 6, 2020

(30) Foreign Application Priority Data

Feb. 1, 2019   (KR) .................. 10-2019-0014111

(51) Int. Cl.
*H01L 51/52*      (2006.01)
*H01L 27/32*      (2006.01)
*H01L 51/00*      (2006.01)

(52) U.S. Cl.
CPC ........ *H01L 51/5268* (2013.01); *H01L 27/322* (2013.01); *H01L 51/0094* (2013.01); *H01L 51/5246* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 9,741,966 B2 | 8/2017 | Chen et al. | |
| 2006/0192485 A1* | 8/2006 | Song | H01L 51/5275 313/506 |
| 2007/0096642 A1* | 5/2007 | Lee | H01L 27/3244 313/506 |
| 2007/0200492 A1* | 8/2007 | Cok | H01L 51/5284 313/506 |
| 2011/0198654 A1 | 8/2011 | Naya | |
| 2012/0286258 A1* | 11/2012 | Naraoka | C09B 3/02 257/40 |
| 2014/0353626 A1* | 12/2014 | Shim | H01L 51/5265 359/601 |

(Continued)

FOREIGN PATENT DOCUMENTS

| | | |
|---|---|---|
| KR | 10-1549773 B1 | 9/2015 |
| KR | 10-2017-0010285 A | 1/2017 |

*Primary Examiner* — Nduka E Ojeh
(74) *Attorney, Agent, or Firm* — Lewis Roca Rothgerber Christie LLP

(57) ABSTRACT

A display device comprises a first substrate comprising at least one light-emitting element; a second substrate facing the first substrate, wherein light emitted from the light-emitting element is to be incident on the second substrate; and a filling layer between the first substrate and the second substrate, wherein the filling layer comprises a filling pattern comprising a first pattern part on the first substrate and having a curve portion formed in at least a part thereof.

31 Claims, 27 Drawing Sheets

(56) References Cited

U.S. PATENT DOCUMENTS

2014/0361264 A1    12/2014   Choi et al.
2015/0048348 A1*   2/2015    Huang .............. G02F 1/133514
                                                       257/40
2016/0322602 A1*   11/2016   Jung ................... H01L 27/1225

* cited by examiner

DISPLAY DEVICE INCLUDING A FILLING PATTERN

CROSS-REFERENCE TO RELATED APPLICATION

This application claims priority to and the benefit of Korean Patent Application No. 10-2019-0014111, filed on Feb. 1, 2019 in the Korean Intellectual Property Office, the entire content of which is incorporated herein by reference.

BACKGROUND

1. Field

The present disclosure relates to a display device.

2. Description of the Related Art

Display devices become more and more important as multimedia technology evolves. Accordingly, a variety of display devices such as liquid-crystal display devices (LCDs) and/or organic light-emitting diode display devices (OLEDs) are currently being developed.

Among display devices, an organic light-emitting display device includes organic light-emitting elements which are self-luminous elements. An organic light-emitting element may include two opposing electrodes and an organic emissive layer interposed therebetween. Electrons and holes respectively supplied from the two electrodes are recombined in the emissive layer to generate excitons, the generated excitons drop from the excited state to the ground state and accordingly light can be emitted.

Such an organic light-emitting display device does not require a separate light source, and thus it consumes less power and can be made (manufactured) to be light and thin, as well as exhibits high-quality characteristics such as wide viewing angle, high luminance and contrast, and/or fast response speed. Accordingly, organic light-emitting display devices are attracting attention as the next generation display device.

SUMMARY

One or more aspects of embodiments of the present disclosure are directed toward a display device that can improve brightness and color gamut by preventing or reducing color mixture between sub-pixels.

It should be noted that embodiments of the present disclosure are not limited to the above-mentioned embodiment; and other embodiments of the present invention should be apparent to those skilled in the art from the following descriptions.

According to an exemplary embodiment of the present disclosure, the brightness and color gamut can be improved by preventing or reducing color mixture between sub-pixels.

According to an exemplary embodiment of the present disclosure, the light extraction efficiency of a display device can be improved.

However, embodiments of the present invention are not restricted to the one set forth herein. The above and other embodiments of the present invention should become more apparent to one of ordinary skill in the art to which the present invention pertains by referencing the detailed description of the present invention given below.

According to an embodiment of the present disclosure, a display device includes a first substrate including at least one light-emitting element, a second substrate facing the first substrate, wherein light emitted from the light-emitting element is to be incident on the second substrate and a filling layer between the first substrate and the second substrate, wherein the filling layer includes a filling pattern including a first pattern part on the first substrate, the first pattern part having a curve portion formed in at least a part thereof.

In an exemplary embodiment, at least a part of the filling pattern overlaps with the light-emitting element, and the light emitted from the light-emitting element is to be incident on the filling pattern.

In an exemplary embodiment, at least a part of the light incident on the filling pattern is to be scattered at the curve portion of the first pattern part.

In an exemplary embodiment, at least a part of the light scattered at the curve portion is to be incident on the second substrate.

In an exemplary embodiment, the curve portion has at least one convex portion protruding upwardly from a straight line extending from one end of the curve portion toward an opposite end thereof, and at least one concave portion protruding downwardly from the straight line, and wherein the convex portion is spaced apart from an adjacent convex portion by 0.5 to 1.5 μm.

In an exemplary embodiment, the filling pattern includes a second pattern part on the first pattern part, and the second pattern part includes substantially the same material as the first pattern part.

In an exemplary embodiment, the first pattern part and the second pattern part include hexamethyldisiloxane (HMDSO).

In an exemplary embodiment, the curve portion of the first pattern part is formed as the hexamethyldisiloxane reacts with molecules containing nitrogen, and the curve portion contains the nitrogen.

In an exemplary embodiment, a content of the nitrogen in the first pattern part is larger than a content of the nitrogen in the second pattern part.

In an exemplary embodiment, a bottom surface of the first pattern part of the filling pattern is in contact with at least a part of the first substrate, and a top surface of the second pattern part of the filling pattern is in contact with at least a part of the second substrate.

In an exemplary embodiment, the second pattern part covers at least a part of the curve portion, and light emitted from the light-emitting element is to be scattered at the curve portion and is to be incident on the second pattern part.

In an exemplary embodiment, the filling pattern includes cells, and cells of the filling pattern are spaced apart from one another, and wherein the filling layer further includes a filling material between the cells of the filling pattern.

In an exemplary embodiment, a bottom surface of the filling pattern is in contact with the first substrate, and a top surface of the filling pattern is in contact with the second substrate, and wherein the filling material is disposed between the cells of the filling pattern.

In an exemplary embodiment, at least a part of the light incident on the filling pattern is to be incident on an interface between a side surface of the filling pattern and the filling material, and wherein at least a part of the light incident on the interface is to be reflected toward the filling pattern.

In an exemplary embodiment, a bottom surface of the filling pattern is in contact with the first substrate, and a top surface of the filling pattern is spaced apart from the second substrate, and wherein the filling material is between the filling pattern and the second substrate and between the cells of the filling pattern.

In an exemplary embodiment, the filling pattern includes a material having a refractive index higher than a refractive index of the filling material, and wherein a difference between the refractive index of the filling pattern and the refractive index of the filling material is larger than 0.3.

In an exemplary embodiment, the difference between the refractive index of the filling pattern and a refractive index of each of the first substrate and the second substrate ranges from 0.01 to 0.3.

According to another embodiment of the present disclosure, a display device includes a first base, at least one organic light-emitting element in each of a plurality of emitting areas defined on the first base, a second base facing the first base, a plurality of light-exiting areas being defined in the second base, and a filling layer between the organic light-emitting element and the second base, the filling layer including a filling pattern composed of cells alternately arranged in one direction when viewed from the top, and a filling material, wherein the filling pattern includes a first pattern part at least partially overlapping with the light-emitting areas and having a curve portion in at least a part thereof, and a second pattern part on the first pattern part and covering the curve portion, and wherein a refractive index of the filling material is smaller than a refractive index of the filling pattern.

In an exemplary embodiment, light emitted from the organic light-emitting element is to be incident on the first pattern part of the filling pattern, and the light incident on the first pattern part is to be scattered at the curve portion.

In an exemplary embodiment, at least a part of the light incident on the first pattern part is to be incident on an interface between a side surface of the filling pattern and the filling material, and wherein at least a part of the light incident on the interface is to be reflected toward the first pattern part.

In an exemplary embodiment, at least a part of the light scattered at the curve portion is to be incident on the second pattern part.

In an exemplary embodiment, at least a part of the light incident on the second pattern part is to be incident on an interface between a side surface of the filling pattern and the filling material, and wherein at least a part of the light incident on the interface is to be reflected toward the first pattern part or the second pattern part.

In an exemplary embodiment, the display device further includes an encapsulation layer between the organic light-emitting element and the filling layer, wherein the filling pattern is on the encapsulation layer such that a bottom surface of the first pattern part is in contact with the encapsulation layer, and a top surface of the second pattern part faces the second base.

In an exemplary embodiment, the encapsulation layer includes the same material as the first pattern part and the second pattern part of the filling pattern.

In an exemplary embodiment, a length of a bottom surface of the filling pattern measured in a direction parallel to the first base is substantially equal to a length of a top surface of the filling pattern measured in the direction.

In an exemplary embodiment, an area of a bottom surface of the filling pattern is larger than an area of a top surface thereof when viewed from the top, and wherein a side surface of the filling pattern is inclined such that the side surface and the encapsulation layer form an acute angle.

In an exemplary embodiment, an area of a bottom surface of the filling pattern is smaller than an area of a top surface thereof when viewed from the top, and wherein a side surface of the filling pattern is inclined such that the side surface and the encapsulation layer form an obtuse angle.

In an exemplary embodiment, the filling pattern includes a first cell of the filling pattern; and a second cell of the filling pattern spaced apart from the first cell in a first direction parallel to the first base, and wherein the filling material is between the first cell and the second cell of the filling pattern.

In an exemplary embodiment, the organic light-emitting element includes: a first organic light-emitting element; and a second organic light-emitting element spaced apart from the first organic light-emitting element, and wherein the plurality of emitting areas includes a first emitting area overlapping with the first organic light-emitting element, and a second emitting area overlapping with the second organic light-emitting element.

In an exemplary embodiment, the second base further includes: a first wavelength conversion pattern between the second base and the first organic light-emitting element; and a second wavelength conversion pattern between the second base and the second organic light-emitting element, and wherein the plurality of light-exiting areas includes: a first light-exiting area overlapping with the first wavelength conversion pattern; and a second light-exiting area overlapping with the second wavelength conversion pattern.

In an exemplary embodiment, light exiting from the first light-exiting area is to be incident on the first cell of the filling pattern, and at least a part of the incident light is to be scattered at the curve portion to be incident on the first wavelength conversion pattern.

In an exemplary embodiment, at least a part of the light incident on the first cell of the filling pattern is to be incident on an interface between a side surface of the first cell of the filling pattern and the filling material, and wherein at least a part of the light incident on the interface is to be reflected toward the first cell of the filling pattern to be incident on the first wavelength conversion pattern.

In an exemplary embodiment, an area of a bottom surface of the first cell of the filling pattern is larger than an area of the first emitting area, and an area of a top surface of the first cell of the filling pattern is substantially equal to an area of the first light-exiting area.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. When a layer is referred to as being "directly on" another layer or substrate, no intervening layers may be present. The same reference numbers indicate the same components throughout the specification and drawings.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

The term "exemplary embodiment(s)" may refer to example embodiment(s).

Hereinafter, exemplary embodiments of the present disclosure will be described with reference to the accompanying drawings.

Figure 1:
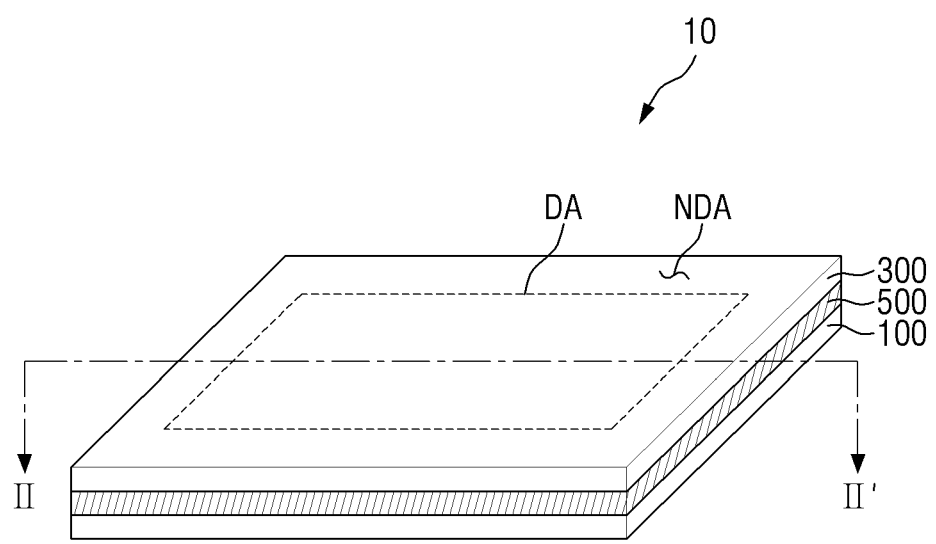
FIG. 1 is a perspective view of a display device according to an exemplary embodiment of the present disclosure.
Figure 2:
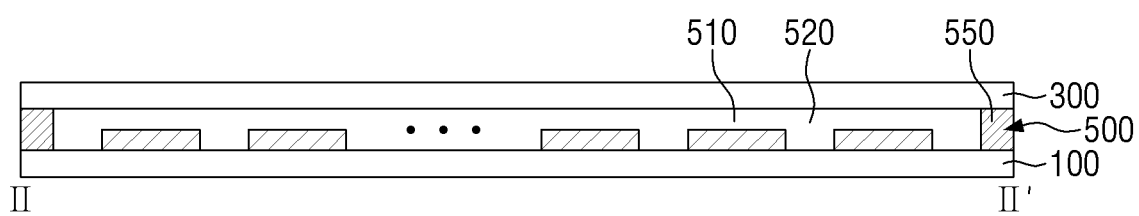
FIG. 2 is a cross-sectional view of the display device, taken along line II-II' of FIG. 1.
Figure 3:
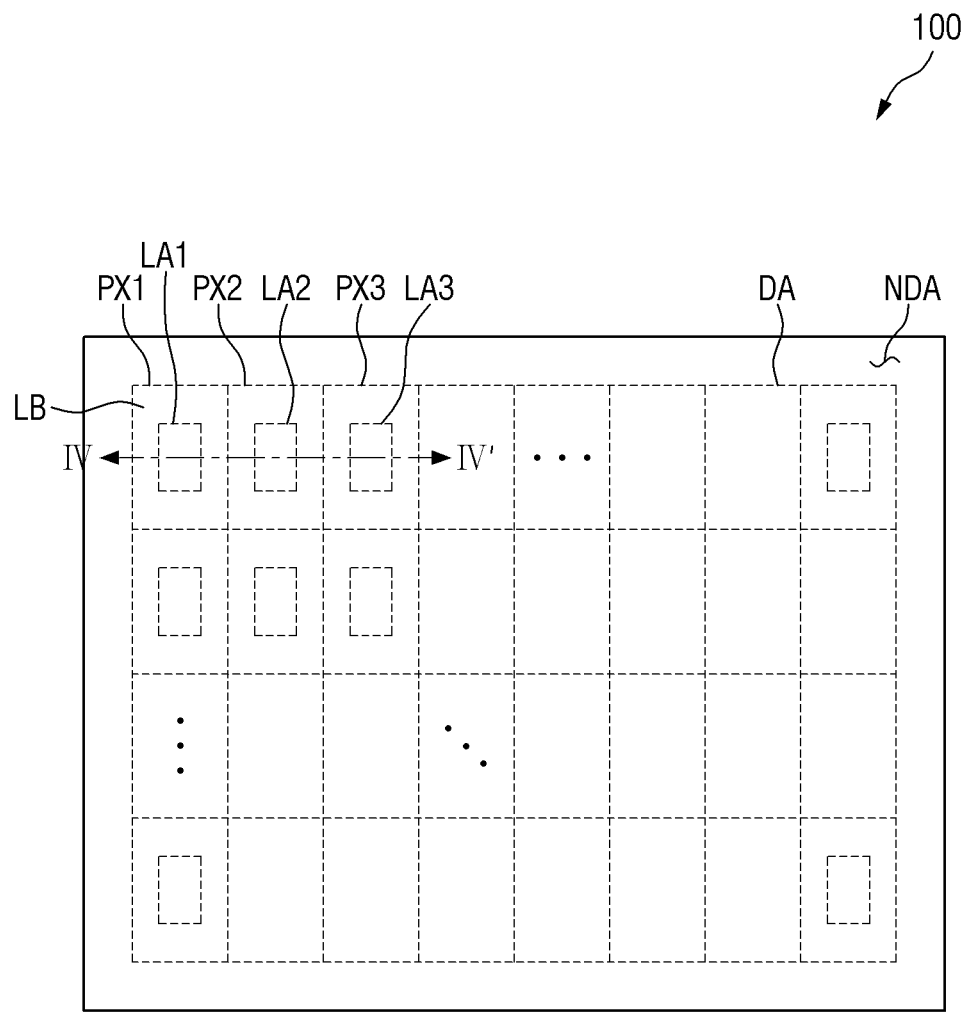
FIG. 3 is a plan view of the display device shown in FIGS. 1 and 2.

FIG. 1 is a perspective view of a display device according to an exemplary embodiment of the present disclosure. FIG. 2 is a cross-sectional view of the display device, taken along line II-II' of FIG. 1. FIG. 3 is a plan view of the display device shown in FIGS. 1 and 2.

A display device 10 shown in FIGS. 1 to 3 may be employed in a variety of electronic devices including small- and-medium sized electronic devices such as a tablet PC, a smartphone, a vehicle navigation unit, a camera, a center information display (CID) installed in vehicles, a wrist-type electronic device, a personal digital assistant (PMP), a portable multimedia player (PMP) and/or a game machine, and/or medium-and-large electronic devices such as a television, an electric billboard, a monitor, a personal computer and/or a laptop computer. It should be understood that the above-listed electronic devices are merely illustrative and the display device 10 may be employed in a variety of other suitable electronic devices without departing from the scope of the present disclosure.

In some exemplary embodiments, the display device 10 may have a rectangular shape when viewed from the top. The display device 10 may have two shorter sides extending in a direction, and two longer sides extending in another direction crossing the direction. Although the corners where the longer sides and the shorter sides of the display device 10 meet may form a right angle, this is merely illustrative. The display device 1 may have rounded corners. The shape of the display device 10 when viewed from the top is not limited to that shown in the drawings. The display device 70 may have a square shape, a circular shape, an elliptical shape or other suitable shapes.

The display device 10 may include a display area DA where images are displayed, and a non-display area NDA where no image is displayed.

The display area DA may be disposed (e.g., located) in the center portion of display device. The display area DA may include a plurality of pixels. The plurality of pixels may include first pixels PX1 emitting light of a first color (e.g., red light having a peak wavelength in the range of approximately 610 to 650 nm), second pixels PX2 emitting light of a second color (e.g., green light having a peak wavelength in the range of approximately 510 to 550 nm), and third pixels PX3 emitting light of a third color (e.g., blue light having a peak wavelength in the range of approximately 430 to 470 nm). The first pixels PX1, the second pixels PX2 and the third pixels PX3 may be arranged repeatedly (e.g., sequentially) in a row direction and in a column direction. The pixels PX1, PX2 and PX3 may be arranged in various suitable shapes such as stripes and/or pantiles.

Each of the pixels PX1, PX2 and PX3 may include an emitting area LA1, LA2 and LA3 and a non-emitting area LB. Each of the emitting areas LA1, LA2 and LA3 is defined as a region where light is emitted by an organic layer, and the non-emitting area LB is defined as a region where light is not emitted by the organic layer. The non-emitting area LB may be disposed to surround the emitting areas LA1, LA2, and LA3. The emitting areas LA1, LA2 and LA3 may be separated from the non-emitting area LB by a bank layer to be described later.

The wavelength of the light emitted from each of the pixels PX1, PX2 and PX3 may be adjusted not only by the light emitted from the emitting areas LA1, LA2 and LA3 but also by wavelength conversion patterns or color filters that overlap the emitting areas LA1, LA2 and LA3. For example, the first emitting area LA1 of each first pixel PX1, the second emitting area LA2 of each second pixel PX2 and the third emitting area LA3 of each third pixel PX3 all may emit light of the same wavelength (e.g., blue light), and the blue light may be converted into different colors for different pixels by the wavelength conversion patterns and/or the color filters disposed in the pixels.

The non-display area NDA may be disposed outside the display area DA to surround it. The non-display area NDA may not include an emitting area. It is, however, to be understood that the present disclosure is not limited thereto. In some embodiments, the non-display area NDA may have substantially the same structure as the emitting area and may include a dummy emitting area that is controlled so as not to emit light, or may include an emitting area and a light- blocking member for blocking light from exiting.

As shown in FIG. 2, the display device 10 may include a first substrate 100, a second substrate 300 facing the first substrate 100, and a filling layer 500 interposed between the first substrate 100 and the second substrate 320. As will be described later, the filling layer 500 may include a filling pattern of cells 510 disposed between the first substrate 100 and the second substrate 300, and a sealing member 550 that couples the first substrate 100 with the second substrate 300 at their edges.

The first substrate 100 may include elements and circuits for displaying images, e.g., a pixel circuit such as a switching element, a bank layer defining the emitting areas LA1, LA2 and LA3 and the non-emitting area LB in the display area DA, and organic light-emitting elements. For example, the first substrate 100 may be a display substrate.

The second substrate 300 is located above the first substrate 100 and faces the first substrate 100. For example, the second substrate 300 may be, but is not limited to, a color conversion substrate including a color conversion pattern for converting the color of incident light.

The sealing member 550 may be disposed between the first substrate 100 and the second substrate 300 in the non-display area NDA. The sealing member 550 may be disposed in the non-display area NDA along the edges of the first substrate 100 and the second substrate 300 to surround the display area DA when viewed from the top. The first substrate 100 and the second substrate 300 may be coupled with each other by the sealing member 550. For example, the sealing member 550 may be made of, but is not limited to, a material including an organic material such as an epoxy resin.

The filling pattern 510 may be disposed in the space between the first substrate 100 and the second substrate 300 surrounded by the sealing member 550 of the filling layer 500. The filling pattern 510 may be disposed on the first substrate 100 so that the filling layer 500 is at least partially filled with the filling pattern 510. The filling pattern 510 includes a material capable of transmitting light, and thus the light output from the first substrate 100 can pass through it.

The cells of the filling pattern 510 are disposed on the first substrate 100 such that they are spaced apart from one another. The cells of the filling pattern 510 may be spaced apart from one another in a first direction d1 or a second direction d2 crossing the first direction d1 and may be arranged on the first substrate 100 substantially in a lattice pattern. It is, however, to be understood that the present disclosure is not limited thereto. In some implementations, the cells of the filling pattern 510 may be spaced apart from one another in a different direction that forms a predetermined (or set) angle with the first direction d1 and the second direction d2.

As described above, the filling pattern 510 may be used to fill the space between the first substrate 100 and the second substrate 300. In FIG. 2, the filling pattern 510 having a predetermined (or set) height is disposed between the first substrate 100 and the second substrate 300, such that the space therebetween and the space between the filling pattern 510 and the second substrate 300 is filled with the filling material 520. It is, however, to be understood that the present disclosure is not limited thereto. In one or more embodiments, the height of the filling pattern 510 is equal to the distance between the first substrate 100 and the second substrate 300 so that the bottom surface and top surface of the filling pattern 510 may be in contact with the first substrate 100 and the second substrate 300, respectively. In one or more embodiments, the filling pattern 510 may be disposed on the entire surface of the first substrate 100 so that the filling layer 500 may be filled with the filling pattern 510. A more detailed description thereon will be given later with reference to other exemplary embodiments.

The filling pattern 510 and the filling material 520 may include materials having different refractive indices. For example, the filling pattern 510 may include a material having a higher refractive index than that of the filling material 520. The filling pattern 510 can reduce differences in the refractive index between the filling layer 500 and each of the first substrate 100 and the second substrate 300. Accordingly, a part of the light output from the first substrate 100 may pass through the filling pattern 510 to be incident on the second substrate 300.

According to an exemplary embodiment of the present disclosure, the filling pattern 510 may include a first pattern part 510a having a curve portion GP formed in at least a part thereof. The curve portion GP formed on the first pattern part 510a can scatter light incident from the first substrate 100. The light scattered by the curve portion GP can pass through the filling pattern 510 to reduce light reflected from the filling material 520 or the second substrate 300. As a result, more of the light output from the first substrate 100 can be incident on the second substrate 300, and thus the light extraction efficiency of the display device 10 can be increased. A more detailed description thereon will be given later.

The filling pattern 510 may include a silicon-based organic material, an epoxy-based organic material, and/or an epoxy-acrylic based organic material. In an exemplary embodiment, the filling pattern 510 may include a silicone rubber and/or hexamethyldisiloxane (HMDSO). The filling material 520 may be either an air layer or a gas layer containing an inert gas such as nitrogen and/or argon or a mixture of a variety of gases.

In an exemplary embodiment, when the filling pattern 510 includes a material having a high refractive index, such as hexamethyldisiloxane (HMDSO), a difference in the refractive index between the first substrate 100 and the second substrate 300 can be reduced. Accordingly, the light output from the first substrate 100 can be efficiently incident on the second substrate 300 through the filling pattern 510. A more detailed description thereon will be given later.

Hereinafter, the structure of the display device 10 will be described in more detail with reference to FIGS. 4 to 7.

Figure 4:
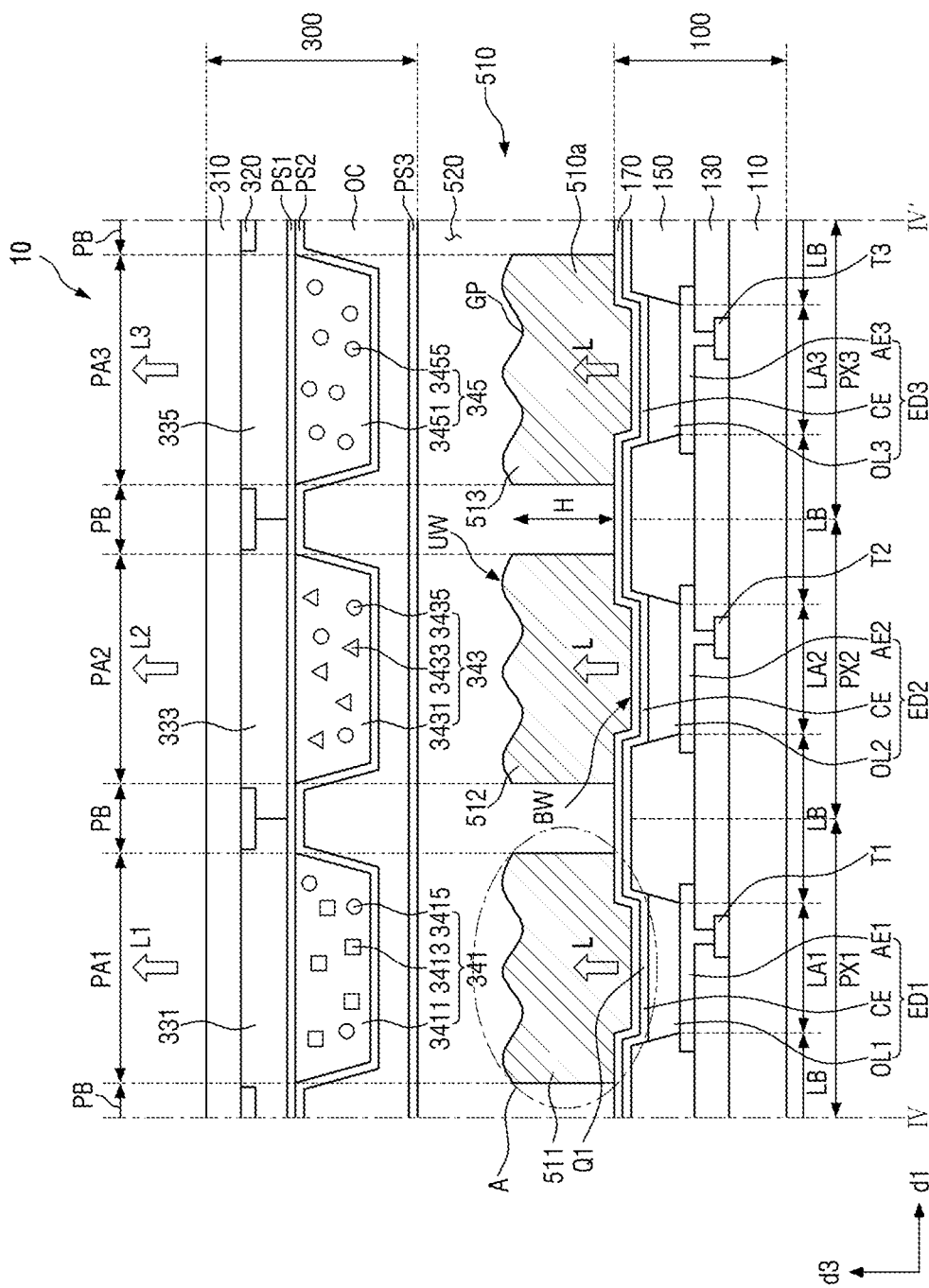
FIG. 4 is a cross-sectional view of a display device according to an exemplary embodiment of the present disclosure, taken along line IV-IV' of FIG. 3.
Figure 5:
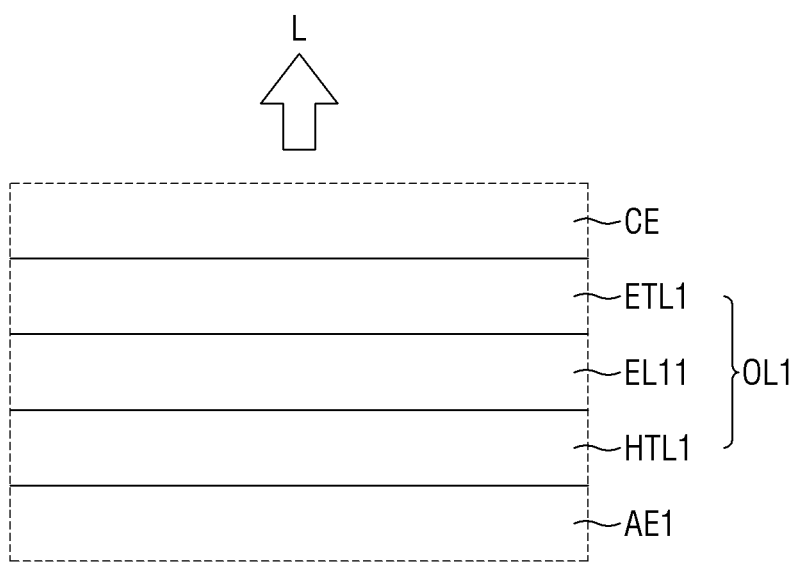
FIG. 5 is an enlarged cross-sectional view of portion Q1 of FIG. 4.
Figure 6:
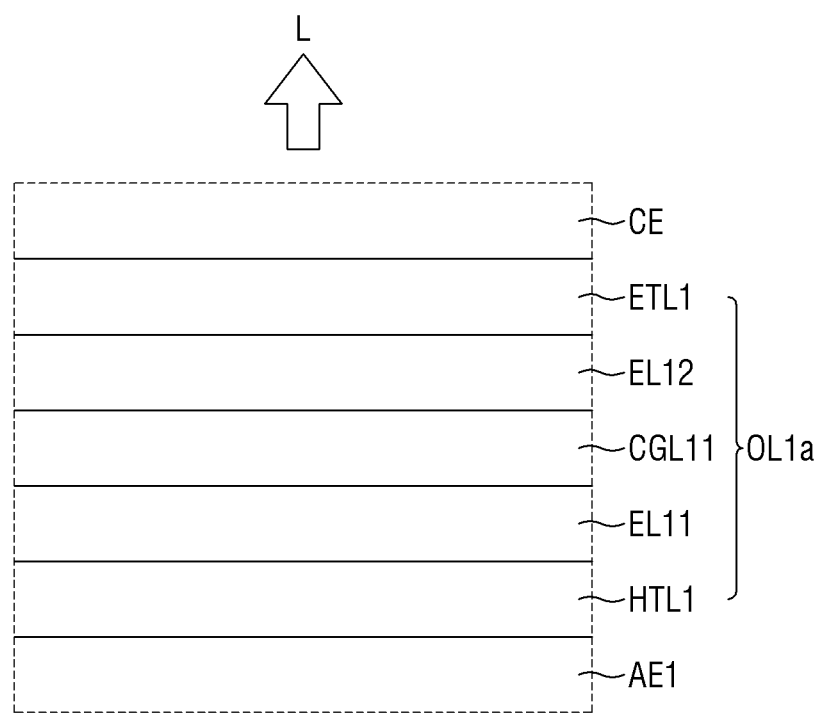
FIG. 6 is a cross-sectional view showing a modification of the structure shown in FIG. 5.
Figure 7:
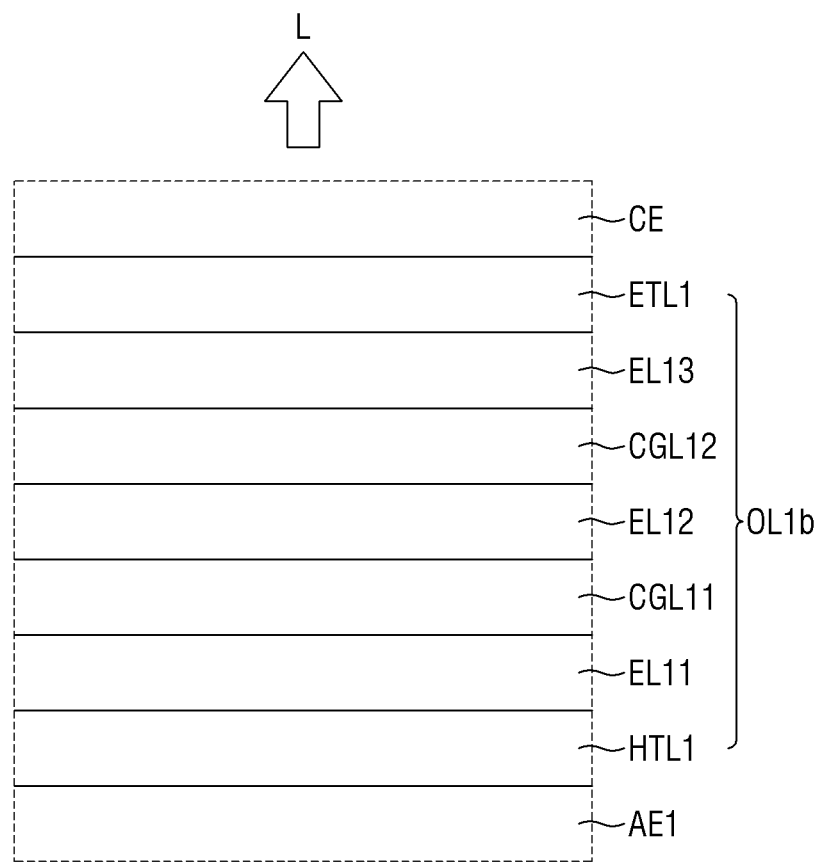
FIG. 7 is a cross-sectional view showing another modification of the structure shown in FIG. 5.

FIG. 4 is a cross-sectional view of the display device according to the exemplary embodiment of the present disclosure, taken along line IV-IV' of FIG. 3. FIG. 5 is an enlarged cross-sectional view of portion Q1 of FIG. 4. FIG. 6 is a cross-sectional view showing a modification of the structure shown in FIG. 5. FIG. 7 is a cross-sectional view showing another modification of the structure shown in FIG. 5.

Referring initially to FIG. 4, the display device 10 may include a first substrate 100, a second substrate 300, and a filling layer 500. The filling layer 500 may include a filling pattern of cells 510 disposed on the first substrate 100.

The first substrate 100 may include a first base 110, switching elements T1, T2 and T3, an insulating layer 130, a bank layer 150, organic light-emitting elements ED1, ED2 and ED3, and an encapsulation layer 170.

The first base 110 may be made of a light-transmitting material. The first base 110 may be a glass substrate and/or a plastic substrate.

At least one switching element T1, T2 and T3 may be disposed in each of the pixels PX1, PX2 and PX3 on the first base 110. A plurality of signal lines (for example, gate lines, data lines, power lines, etc.) for transmitting signals to the switching elements may be further disposed on the first base 110.

The insulating layer 130 may be disposed over the switching elements T1, T2, and T3. The insulating layer 130 may be formed of an organic layer. For example, the insulating layer 130 may include an acrylic resin, an epoxy resin, an imide resin, an ester resin, etc.

The pixel electrodes AE1, AE2 and AE3 may be disposed on the insulating layer 130 in the pixels PX1, PX2 and PX3, respectively. The pixel electrodes AE1, AE2 and AE3 may be located within the emitting areas LA1, LA2 and LA3, respectively, and at least a part thereof may be extended to the non-emitting area LB. The pixel electrodes AE1, AE2 and AE3 may be connected to the switching elements T1, T2 and T3, respectively, through via holes passing through the insulating layer 130.

In an exemplary embodiment, each of the pixel electrodes AE1, AE2 and AE3 may be the anode electrode of the respective organic light-emitting emitting element. The pixel electrodes AE1, AE2 and AE3 may include a material having a high work function for easy injection of holes, such as indium-tin-oxide (ITO), indium-zinc-oxide (IZO), zinc oxide (ZnO), and/or indium oxide ($In_2O_3$). When the display device 10 is a top-emission display device, for example, the pixel electrodes AE1, AE2 and AE3 may further include a reflective metal layer. The reflective metal layer may include, for example, silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca) or a mixture thereof. In some exemplary embodiments, the pixel electrodes AE1, AE2 and AE3 may have a two-layer structure selected from ITO/Ag, Ag/ITO, ITO/Mg and ITO/MgF, or a multi-layer structure of ITO/Ag/ITO. It is, however, to be understood that the present disclosure is not limited thereto.

The bank layer 150 may be disposed over the pixel electrodes AE1, AE2 and AE3. The bank layer 150 is disposed along the boundaries of the pixels PX1, PX2, and PX3. The bank layer 150 may be formed in a lattice pattern and may include openings that partially expose the pixel electrodes AE1, AE2 and AE3. As described above, the light-emitting areas LA1, LA2 and LA3 may be separated from the non-emitting area LB by the bank layer 150. The portions of the pixel electrodes AE1, AE2 and AE3 which are not covered by the bank layer 150 but are exposed may correspond to the emitting areas LA1, LA2 and LA3, respectively, whereas the portions covered by the bank layer 150 may correspond to the non-emitting area.

In some exemplary embodiments, the bank layer 150 may include an organic insulating material such as polyacrylate resin, epoxy resin, phenolic resin, polyamide resin, polyimide resin, unsaturated polyesters resin, poly phenylene ether resin, poly phenylene sulfide resin, and/or benzocyclobutene (BCB). It is, however, to be understood that the present disclosure is not limited thereto.

Organic layers OL1, OL2 and OL3 may be disposed on the portions of the pixel electrodes AE1, AE2 and AE3 exposed via the openings of the bank layer 150, respectively. The organic layers OL1, OL2 and OL3 will be described in more detail with reference to FIGS. 5 and 7.

Although FIGS. 5 to 7 show only the stack structure of the first organic layer OL1 among the organic layers OL1, OL2 and OL3, the other organic layers OL2 and OL3 may have the same stack structure.

Referring to FIG. 5, according to an exemplary embodiment of the present disclosure, the first organic layer OL1 may include a first hole transport layer HTL1 disposed on the first pixel electrode AE1, a first emissive layer EL11 disposed on the first hole transport layer HTL1, and a first electron transport layer ETL1 disposed on the first emissive layer EL11. According to the exemplary embodiment of the present disclosure, the first organic layer OL1 may include only a single emissive layer, for example, the first emissive layer EL11 as the emissive layer. The first emissive layer EL11 may be a blue emissive layer. It is to be understood that the stack structure of the first organic layer OL1 is not limited to the structure of FIG. 5 and may be modified as shown in FIG. 6 or FIG. 7.

Referring to FIG. 6, the first organic layer OL1a may further include a first charge generation layer CGL11 disposed on the first emissive layer EL11, and a second emissive layer EL12 disposed on the first charge generation layer CGL11. The first charge (electron) transport layer ETL1 may be disposed on the second emissive layer EL12.

The first charge generation layer CGL11 may serve to inject charges into the adjacent emissive layers. The first charge generation layer CGL11 may serve to adjust the charge balance between the first emissive layer EL11 and the second emissive layer EL12. In some exemplary embodiments, the first charge generation layer CGL11 may include an n-type charge generation layer and a p-type charge generation layer. The p-type charge generation layer may be disposed on the n-type charge generation layer.

The second emissive layer EL12 may emit blue light like the first emissive layer EL11. It is, however, to be understood that the present disclosure is not limited thereto. The second emissive layer EL12 may emit blue light having either the same peak wavelength as or different peak wavelength from that of the first emissive layer EL11. In another embodiment, the first emissive layer EL11 and the second emissive layer EL12 may emit light of different colors. That is, the first emissive layer EL11 may emit blue light whereas the second emissive layer EL12 may emit green light.

The first organic layer OL1a having the above-described structure includes two emissive layers, so that the light extraction efficiency and lifetime can be improved compared with the structure of FIG. 5.

FIG. 7 illustrates that a first organic layer OL1b may include three emissive layers EL11, EL12 and EL13 and two charge generation layers CGL11 and CGL12 interposed therebetween. As shown in FIG. 7, the first organic layer OL1b may further include a first charge generation layer CGL11 disposed on a first emissive layer EL11, a second emissive layer EL12 disposed on the first charge generation layer CGL11, a second charge generation layer CGL12 disposed on the second emissive layer EL12, and a third emissive layer EL13 disposed on the second charge generation layer CGL12. The first charge (electron) transport layer ETL1 may be disposed on the third emissive layer EL13.

The third emissive layer EL13 may emit blue light like the first emissive layer EL11 and the second emissive layer EL12. In an exemplary embodiment, each of the first emissive layer EL11, the second emissive layer EL12 and the third emissive layer EL13 may emit blue light of the same wavelength peak or different wavelength peaks. In another exemplary embodiment, the first emissive layer EL11, the second emissive layer EL12 and the third emissive layer EL13 may emit light of different colors. For example, each of the emissive layers may emit blue or green light or the emissive layers may emit red, green, and blue light, respectively, to emit white light as a whole.

Referring back to FIG. 4, the organic layers OL1, OL2 and OL3 may be separately disposed in the respective pixels. For example, the organic layers OL1, OL2 and OL3 may be disposed on the pixel electrodes PX1, PX2 and PX3, respectively, exposed via the openings of the bank layer 150, such that they may be separated from one another by the bank layer 150.

It is, however, to be understood that the present disclosure is not limited thereto. The organic layers OL1, OL2 and OL3 may be connected to one another across adjacent pixels. For example, the first organic layer OL1, the second organic layer OL2 and the third organic layer OL3 may be connected to one another beyond the bank layer 150. It should be noted that since only the portion of the organic layer in contact with each pixel electrode AE1, AE2 and AE3 emits light, substantially the same light-emitting areas as the structure shown in FIG. 4 can be formed. In such case, a process of separating the organic layers from pixel to pixel can be omitted, and the process efficiency can be improved.

In one or more embodiments, some of the stacked films of the organic layers OL1, OL2 and OL3 may be separated from pixel to pixel, while the others of the stacked films may be formed across the pixels. For example, the emissive layer of each of the organic layers may be separated from pixel to pixel while the hole transport layer and/or the electron transport layer may be formed as a common layer. It is, however, to be understood that the present disclosure is not limited thereto.

Referring back to FIG. 4, a common electrode CE is disposed on the organic layers OL1, OL2 and OL3. The common electrode CE may be disposed on the whole surface across the pixels PX1, PX2 and PX3.

When each of the pixel electrodes AE1, AE2 and AE3 is the anode electrode of the respective organic light-emitting element, the common electrode CE is the cathode electrode of the organic light-emitting element. The common electrode CE may include a material having a low work function to allow for easy injection of electrons, for example, Li, Ca, LiF/Ca, LiF/Al, Al, Mg, Ag, Pt, Pd, Ni, Au, Nd, Ir, Cr, BaF, Ba, etc. or a compound or mixture thereof (e.g., a mixture of Ag and Mg).

When the display device 10 is a top-emission display device, the common electrode CE may be transparent or transflective. The common electrode CE may be formed of a material having a low work function so as to have a thickness in the range of several tens to several hundreds Å, so that it may be transparent or transflective. When the common electrode CE includes a thin metal film having a low work function, it may further include a transparent conductive material layer disposed on the thin metal film such as tungsten oxide (WxOx), titanium oxide (TiO$_2$), indium tin oxide (ITO), indium zinc oxide (IZO), zinc oxide (ZnO), indium tin zinc oxide (ITZO) and/or magnesium oxide (MgO), in order to reduce the resistance and to achieve the transmittance.

The first pixel electrode AE1, the first organic layer OL1 and the common electrode CE may form the first organic light-emitting element ED1. The second pixel electrode AE2, the second organic layer OL2 and the common electrode CE may form the second organic light-emitting element ED2. The third pixel electrode AE3, the third organic layer OL3 and the common electrode CE may form the third organic light-emitting element ED3.

The encapsulation layer 170 may be disposed on the common electrode CE. In order to prevent or reduce impurities or moisture from permeating from the outside, the encapsulation layer 170 may be disposed above the organic light-emitting elements ED1, ED2 and ED3 to seal the first substrate 100.

The encapsulation layer 170 may be disposed on the whole (entire) surface across the pixels PX1, PX2 and PX3.

In an exemplary embodiment, the encapsulation layer 170 may directly cover the common electrode CE. In another exemplary embodiment, a capping layer may be further disposed between the encapsulation layer 170 and the common electrode CE to cover the common electrode CE, in which case the encapsulation layer 170 may directly cover the capping layer.

It is to be understood that the structure of the encapsulation layer 170 is not limited thereto. As an example, the encapsulation layer 170 may have a greater number of stack structures. A more detailed description thereon will be given below.

The second substrate 300 may include a second base 310, a light-blocking member 320, color filters 331, 333 and 335, wavelength conversion patterns 341 and 343, a light transmission pattern 345, a planarization layer OC, and capping layers PS1, PS2 and PS3.

Light-exiting areas PA1, PA2 and PA3 and a non-light-exiting area PB may be defined on the second substrate 300. The light-exiting areas PA1, PA2 and PA3 are defined as areas where light exits to the outside, and the non-light-exiting area PB is defined as an area where light is blocked and does not exit to the outside. The non-light-exiting area PB may be disposed to surround the light-exiting areas PA1, PA2 and PA3. The light-exiting areas PA1, PA2 and PA3 may include the above-described emitting areas LA1, LA2 and LA3, respectively, and may include at least a part of the non-emitting area LB. The non-light-exiting area PB may be disposed in the non-emitting area LB. That is, the area of the light-exiting areas PA1, PA2, and PA3 may be greater than the area of the emitting areas LA1, LA2 and LA3, and the area of the non-light-exiting area PB may be smaller than the area of the non-emitting area LB.

The second base 310 may be made of a light-transmitting material. The second base 310 may be a glass substrate and/or a plastic substrate.

The light-blocking member 320 may be disposed on the second base 310. The light-blocking member 320 may be disposed along the boundaries of the pixels PX1, PX2 and PX3 and may block or reduce transmission of light. For example, the light-blocking member 320 may be formed in a lattice pattern when viewed from the top and can prevent or reduce color mixture which occurs when light crosses over the adjacent light-exiting areas PA1, PA2 and PA3. The light-exiting areas PA1, PA2 and PA3 may be separated from the non-light-exiting area PB by the light-blocking member 320. For example, the portions of the second base 310 that do not overlap with the light-blocking member 320 become the light-exiting areas PA1, PA2 and PA3, and the portion of the second base 310 that overlaps with the light-blocking member 320 becomes the non-light-exiting area PB.

The light-blocking member 320 may be formed of an organic material or a metal material including chromium. In one or more exemplary embodiments, the light-blocking member 320 may be, but is not limited to, carbon black or an organic black matrix.

The color filters 331, 333 and 335 may be disposed on the second base 310 and the light-blocking member 320. The first color filter 331 may overlap with the first light-exiting area PA1, the second color filter 333 may overlap with the second light-exiting area PA2, and the third color filter 335 may overlap with the third light-exiting area PA3.

The color filters 331, 333 and 335 may selectively transmit light of a particular color and absorb light of other colors to block the transmission of the light. For example, the first color filter 331 may transmit light of a first color and absorb light of a second color and light of a third color to block them. As described above, the light of the first color may be red light, the light of the second color may be green light, and the light of the third color may be blue light. For example, the first color filter 331 may be a red color filter that transmits red light and blocks and absorbs green light and blue light, and may include a red colorant.

For example, the second color filter 333 may transmit light of the second color and absorb light of the first color and light of the third color to block them. For example, the second color filter 333 may be a green color filter that transmits green light and blocks and absorbs red light and blue light, and may include a green colorant.

The third color filter 335 may transmit light of the third color and absorb light of the first color and light of the second color to block them. For example, the third color filter 335 may be a blue color filter that transmits blue light and blocks and absorbs red light and green light, and may include a blue colorant.

In some exemplary embodiments, the boundaries among the color filters 331, 333 and 335 may be located in the non-light-exiting area PB. The light-blocking member 320 may be disposed between the boundaries among the color filters 331, 333 and 335 and the second base 310.

The first capping layer PS1 may be disposed on the color filters 331, 333 and 335. The first capping layer PS1 can prevent or reduce impurities such as moisture and air from permeating from the outside to damage and/or contaminate the color filters 331, 335 and 333. In addition, the first capping layer PS1 can prevent or reduce the colorant included in each of the color filters 331, 333 and 335 from diffusing into other elements. In one or more exemplary embodiments, the first capping layer PS1 may be made of an inorganic material. For example, the first capping layer PS1 may be made of a material including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

The wavelength conversion patterns 341 and 343 and the light transmission pattern 345 may be disposed on the first capping layer PS1.

The first wavelength conversion pattern 341 may be disposed in the first light-exiting area PA1 and not disposed in the second light-exiting area PA2 and the third light-exiting area PA3. The first wavelength conversion pattern 341 may convert the peak wavelength of the incident light into light of another peak wavelength so that the light exits. For example, the first wavelength conversion pattern 341 may convert blue light into red light in the range of approximately 610 to approximately 650 nm.

The first wavelength conversion pattern 341 may include a first base resin 3411 and a first wavelength-converting material 3413 dispersed in the first base resin 3411, and may further include first scatterers 3415 dispersed in the first base resin 3411.

The material of the first base resins 3411 is not particularly limited as long as it has a high light transmittance and the first wavelength-converting material 3413 and the first scatterers 3415 can be dispersed well therein. For example, the first base resin 3411 may include an organic material such as an epoxy resin, an acrylic resin, a cardo resin, and/or an imide resin.

The first wavelength-converting material 3413 may convert the peak wavelength of the incident light into light of another peak wavelength. Non-limiting examples of the first wavelength-converting material 3413 may include quantum dots, quantum rods and/or phosphors. Quantum dots may be particulate matter that emits light of a color as electrons transition from the conduction band to the valence band.

The quantum dots may be semiconductor nanocrystalline material. The quantum dots have a specific band gap depending on their compositions and size, and can absorb light and emit light having an intrinsic wavelength. Non-limiting examples of the semiconductor nanocrystals of the quantum dots may include Group IV nanocrystals, Groups II-VI compound nanocrystals, Groups III-V compound nanocrystals, Groups IV-VI nanocrystals, and combinations thereof.

Examples of the Group IV nanocrystals may include, but are not limited to, binary compounds such as silicon (Si), germanium (Ge), silicon carbide (SiC) and/or silicon-germanium (SiGe).

In addition, examples of the Group II-VI compound nanocrystals may include, but are not limited to, binary compounds such as CdSe, CdTe, ZnS, ZnSe, ZnTe, ZnO, HgS, HgSe, HgTe, MgSe, and/or MgS; ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; and quaternary compounds such as HgZnTeS, CdZnSeS, CdZnSeTe, CdZnSTe, CdHgSeS, CdHgSeTe, CdHgSTe, HgZnSeS, HgZnSeTe, and/or HgZnSTe.

Examples of the Group III-V compound nanocrystals may include, but are not limited to, binary compounds such as GaN, GaP, GaAs, GaSb, AlN, AlP, AlAs, AlSb, InN, InP, InAs, and/or InSb; ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, and/or GaAlNP; and quaternary compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb.

Examples of the Group IV-VI nanocrystals may include binary compounds such as SnS, SnSe, SnTe, PbS, PbSe, and/or PbTe; ternary compounds such as SnSeS, SnSeTe, SnSTe, PbSeS, PbSeTe, PbSTe, SnPbS, SnPbSe, and/or SnPbTe; and quaternary compounds such as SnPbSSe, SnPbSeTe, and/or SnPbSTe.

The quantum dots may have a core-shell structure including a core comprising the nanocrystals and a shell surrounding the core. The shells of the quantum dots may serve as a protective layer for maintaining the semiconductor properties by preventing or reducing chemical denaturation of the core and/or as a charging layer for imparting electrophoretic properties to the quantum dots. The shell may be either a single layer or multiple layers. Non-limiting examples of the shell of the quantum dot may include an oxide of a metal or a non-metal, a semiconductor compound, a combination thereof, etc.

Examples of the metal or non-metal oxide may include, but are not limited to, binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO and ternary compounds such as $MgAl_2O_4$, $CoFe_2O_4$, $NiFe_2O_4$ and/or $CoMn_2O_4$.

Examples of the semiconductor compound may include, but are not limited to, CdS, CdSe, CdTe, ZnS, ZnSe, ZnTe, GaAs, GaP, GaSb, HgS, HgSe, HgTe, InAs, InP, InSb, AlAs, AlP, AlSb, etc.

The light emitted from the first wavelength-converting material 3413 may have a full width of half maximum (FWHM) of the emission wavelength spectrum of approximately 45 nm or less, or approximately 40 nm or less, or approximately 30 nm or less. In this manner, the color purity and color gamut of the color displayed by the display device can be improved. In addition, the light output from the first wavelength-converting material 3413 may travel in different directions regardless of the incidence direction of the incident light. This can improve the side visibility of the display device.

A part of the light L provided from the first organic light-emitting element ED1 may not be converted into red light by the first wavelength-converting material 3413 but may pass through the first wavelength conversion pattern 341. The components that are incident on the first color filter 331 without being converted by the first wavelength conversion pattern 341 can be blocked by the first color filter 331. On the other hand, the red light converted by the first wavelength conversion pattern 341 may pass through the first color filter 331 to exit to the outside. Accordingly, the first exit light L1 exiting to the outside from the first light-exiting area PA1 may be red light.

The first scatterers 3415 may have a refractive index different from that of the first base resin 3411 and may form an optical interface with the first base resin 3411. For example, the first scatterers 3415 may be light scattering particles. The material of the first scatterers 3415 is not particularly limited as long as they can scatter at least a part of the transmitted light. For example, the scatterers 3415 may be metal oxide particles and/or organic particles. Non-limiting examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Non-limiting examples of the material of the organic particles may include an acrylic resin, a urethane resin, etc. The first scatterers 3415 can scatter the light transmitted through the first wavelength conversion pattern 341 in random directions regardless of the direction in which the incident light is coming, without substantially changing the wavelength of the light. By doing so, the length of the path in which the light passes through the first wavelength conversion pattern 341 can be increased, and the color conversion efficiency by the wavelength-converting material 3413 can be increased.

In some exemplary embodiments, the thickness of the first wavelength conversion pattern 341 may be approximately 3 to approximately 15 μm. The content of the first wavelength-converting material 3413 included in the first wavelength conversion pattern 341 may range from approximately 10% to approximately 60% by weight. The content of the first scatterers 3415 included in the first wavelength conversion pattern 341 may range from approximately 2% to approximately 15% by weight.

The second wavelength conversion pattern 343 may be disposed in the second light-exiting area PA2 and not disposed in the first light-exiting area PA1 and the third light-exiting area PA3. The second wavelength conversion pattern 343 may convert the peak wavelength of the incident light into light of another peak wavelength so that the light exits. For example, the second wavelength conversion pattern 343 may convert blue light into green light in the range of approximately 510 to approximately 550 nm.

The second wavelength conversion pattern 343 may include a second base resin 3431 and a second wavelength-converting material 3433 dispersed in the second base resin 3431, and may further include second scatterers 3435 dispersed in the second base resin 3431.

The material of the second base resins 3431 is not particularly limited as long as it has a high light transmittance and the second wavelength-converting material 3433 and the second scatters 3435 can be dispersed well therein. For example, the second base resin 3431 may include an organic material such as an epoxy resin, an acrylic resin, a cardo resin, and/or an imide resin.

As described above, the second wavelength-converting material 3433 may convert the peak wavelength of the incident light into light of another peak wavelength. The second wavelength-converting material 3433 may convert blue light having a peak wavelength in the range of approximately 430 to approximately 470 nm into green light having a peak wavelength in the range of approximately 510 to approximately 550 nm.

Non-limiting examples of the second wavelength-converting material 3433 may include quantum dots, quantum rods and phosphors. The second wavelength-converting material 3433 is substantially identical to the first wavelength-converting material 3413; and, therefore, the redundant description will not be provided again.

The first wavelength-converting material 3413 and the second wavelength-converting material 3433 may all be quantum dots. In such case, the diameter of the quantum dots forming the first wavelength-converting material 3413 may be larger than the diameter of the quantum dots forming the second wavelength-converting material 3433. For example, the quantum dot size of the first wavelength-converting material 3413 may be approximately 55 to approximately 65 Å. In addition, the quantum dot size of the second wavelength-converting material 3433 may be approximately 40 to approximately 50 Å.

After the light passes through the first wavelength conversion layer 341 and the second wavelength conversion layer 343, the polarization of the light may be cancelled, i.e., the light be in unpolarized state. The unpolarized light refers to light that does not consist only of polarization components in a particular direction, but that consists of random polarization components that are not polarized in a particular direction. An example of the unpolarized light may be natural light.

The second scatterers 3435 may have a refractive index different from that of the second base resin 3431 and may form an optical interface with the second base resin 3431. For example, the second scatterers 3435 may be light scattering particles. The second scatterers 3435 are substantially identical to the first scatterers 3415 described above; and, therefore, the redundant description will not be provided again.

In one or more exemplary embodiments, the thickness of the second wavelength conversion pattern 343 may be approximately 3 to approximately 15 μm. The content of the second wavelength-converting material 3433 included in the second wavelength conversion pattern 343 may range from approximately 10% to approximately 60% by weight. The content of the second scatterers 3435 included in the second wavelength conversion pattern 343 may range from approximately 2% to approximately 15% by weight.

The light emitted from the second organic light-emitting element ED2 may be provided to the second wavelength conversion material 343. The second wavelength-converting material 3433 may convert the light provided from the second organic light-emitting element ED2 into green light having a peak wavelength in the range of approximately 510 to approximately 550 nm.

A part of the light L provided from the second organic light-emitting element ED2 may not be converted into green light by the second wavelength-converting material 3433 but may pass through the second wavelength conversion pattern 343, and may be blocked by the second color filter 333. On the other hand, a part of the light L that is converted into the green light by the second wavelength-converting pattern 343 passes through the second color filter 333 and exits to the outside. Accordingly, the second exit light L2 exiting to the outside from the second first light-exiting area PA2 may be green light.

The light transmission pattern 345 may be disposed in the third light-exiting area PA3 and not disposed in the first light-exiting area PA1 and the second light-exiting area PA2. The light transmission pattern 345 can transmit incident light.

The light transmission pattern 345 may further include a third base resin 3451 and third scatterers 3455 dispersed in the third base resin 3451.

The third base resin 3451 may be made of an organic material having a high transmittance and may be made of the same material as the first base resin 3411, or may include at least one of the materials listed above as the examples of the constituent materials of the first base resin 3411.

The third scatterers 3455 may have a refractive index different from that of the third base resin 3451 and may form an optical interface with the third base resin 3451. For example, the third scatterers 3455 may be light scattering particles. The material of the third scatterers 3455 is not particularly limited as long as they can scatter at least a part of the transmitted light. For example, the scatterers 3455 may be metal oxide particles and/or organic particles. Non-limiting examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Non-limiting examples of the material of the organic particles may include an acrylic resin, a urethane resin, etc. The third scatterers 3455 can scatter light in random directions regardless of the direction in which the incident light is coming, without substantially changing the wavelength of the light transmitted through the light transmission pattern 345. In this manner, the side visibility of the light passing through the light transmission pattern 345 can be improved.

The light L provided from the third organic light-emitting element ED3 passes through the light transmission pattern 345 and the third color filter 335 and exits to the outside. That is, the third exit light L3 escaping from the third exit light area PA3 may have the same wavelength as the light L emitted from the third organic light-emitting element ED3 as the blue light.

In one or more exemplary embodiments, a low refractive layer may be further disposed between the first capping layer PS1 and each of the first wavelength conversion pattern 341, the second wavelength conversion pattern 343 and the light transmission pattern 345. The low refractive layer may be disposed across the first light-exiting area PA1, the second light-exiting area PA2, the third light-exiting area PA3, and the non-light-exiting area PB. The low refractive layer may have a lower refractive index than the first wavelength conversion pattern 341, the second wavelength conversion pattern 343 and the light transmission pattern 345. For example, a difference in the refractive index between the low refractive layer and each of the first wavelength conversion pattern 341, the second wavelength conversion pattern 343 and the light transmission pattern 345 may be equal to or greater than 0.3. The low refractive layer may include a base resin and particles dispersed in the base resin. The particles included in the low refractive layer may be at least one selected from zinc oxide (ZnO) particles, titanium dioxide ($TiO_2$) particles, hollow silica particles, non-hollow silica particles, nano silicate particles and porogen particles.

The low refractive layer may reflect some of the light traveling toward the second base 310 from the first wavelength conversion pattern 341 and the second wavelength conversion pattern 343 back to the first wavelength conversion pattern 341 and the second wavelength conversion pattern 343. That is, the low refractive layer recycles at least part of the light traveling toward the second base 310, thereby improving the light utilization efficiency and improving the light extraction efficiency of the display device.

The second capping layer PS2 may be disposed on the first wavelength conversion pattern 341 and the second wavelength conversion pattern 343. The second capping layer PS2 may cover the first wavelength conversion pattern 341 and the second wavelength conversion pattern 343 and in some exemplary embodiments the second capping layer PS2 may be disposed on the light transmission pattern 345 to cover it. The second capping layer PS2 can seal the first wavelength conversion pattern 341 and the second wavelength conversion pattern 343 together with the first capping layer PS1 so that it is possible to prevent or reduce impurities such as moisture and air from permeating from the outside to damage and/or contaminate the first wavelength conversion pattern 341 and the second wavelength conversion pattern 343. In one or more exemplary embodiments, the second capping layer PS2 may be made of an inorganic material. The second capping layer PS2 may be made of the same material as the first capping layer PS1 or may include at least one of those listed above as the materials of the first capping layer PS1.

In one or more exemplary embodiments, a filter layer may be further disposed on the wavelength conversion patterns 341 and 343 and the light transmission pattern 345. The filter layer may be a reflective filter that transmits light having a particular wavelength range and reflects light having other wavelength ranges. For example, the filter layer may transmit light of the third color and may reflect light of the first color and light of the second color.

The filter layer recycles light of the first color and light of the second color, which travel toward the first substrate 100 from the wavelength conversion patterns 341 and 343, back to the second base 310, so that the light extraction efficiency can be improved. In addition, the filter layer transmits the light of the third color provided from the organic light-emitting elements ED1, ED2 and ED3 while reflecting the light having a longer center wavelength than the light of the third color, so that it is possible to improve the color purity of the light of the third color provided from the organic light-emitting elements ED1, ED2 and ED3.

The planarization layer OC may be further disposed on the second capping layer PS2. When the thicknesses of the first wavelength conversion pattern 341, the second wavelength conversion pattern 343 and the light transmission pattern 345 are different from one another and/or when the elements are spaced apart from one another during processes, the planarization layer OC can provide a generally flat surface over the different heights of the elements. In one or more embodiments, the planarization layer OC may not be included.

The material of the planarization layer OC is not particularly limited herein as long as it can provide a flat surface. In one or more exemplary embodiments, the planarization layer OC may include an organic material. For example, the organic material may include a cardo-based resin, a polyimide-based resin, an acrylic-based resin, a siloxane-based resin, and/or a silsesquioxane-based resin.

The third capping layer PS3 may be further disposed on the planarization layer OC. The third capping layer PS3 may completely cover the planarization layer OC. When the planarization layer OC is not included as described above, the third capping layer PS3 may also not be included. The third capping layer PS3 may be made of an inorganic material. The third capping layer PS3 may be made of the same material as the first capping layer PS1 or may include at least one of those listed above as the materials of the first capping layer PS1.

The filling layer 500 may be disposed between the second substrate 300 and the first substrate 100. As described above, the filling layer 500 may include the filling pattern of cells 510 and the filling material 520 disposed on the first substrate 100, and the sealing member 550 that couples the first substrate 100 with the second substrate 300. It should be noted that the sealing member 550 located in the non-display area NDA of the display device 10 is not shown in some of the drawings for convenience of explanation. Hereinafter, the filling pattern 510 and the filling material 520 will be described in more detail.

The filling pattern 510 may be disposed on the encapsulation layer 170 of the first substrate 100. The cells of the filling pattern 510 may be spaced apart from one another, and may be disposed to cover at least a part of the encapsulation layer 170. The filling pattern 510 may provide a path for the light L in which the light output from the first substrate 100 is incident on the second substrate 300. The light L output from the first substrate 100 may pass through the filling layer 500 and may be incident on the second substrate 300. Then, it exits out of the display device 10 through the light-exiting area PA. The filling pattern 510 disposed on the first substrate 100 can reduce a difference in the refractive index between the first substrate 100 and the second substrate 300 so that it is possible to prevent or reduce the light L from being reflected off the interface between the filling layer 500 and the first substrate 100.

In one or more embodiments, the filling pattern 510 may be disposed on the encapsulation layer 170 such that at least a part of it overlaps with the organic light-emitting elements ED of the first substrate 100. The light L emitted from the emitting area LA of each of the organic light-emitting elements ED may be incident on the bottom surface BW of the filling pattern 510. As the filling pattern 510 overlaps with the organic light-emitting elements ED, the light L emitted from the emitting area LA may be incident on the bottom surface BW.

In one or more exemplary embodiments, at least a part of the filling pattern 510 is arranged to overlap with the light-emitting LA of the organic light-emitting elements ED, and the area of the bottom surface BW of the filling pattern 510 may be equal to or greater than the area of the emitting area LA. For example, as the filling pattern 510 is disposed such that it substantially includes the emitting area LA, most of the light L emitted from the emitting area LA can be incident on the filling pattern 510. It is, however, to be understood that the present disclosure is not limited thereto.

The bottom surface BW of the filling pattern 510 may be disposed to cover the level difference of the encapsulation layer 170 and at least a part of the bottom surface BW may protrude. As will be described later, the filling pattern 510 may include organic matter, may cover the level differences formed on the encapsulation layer 170 and may have a predetermined (or set) height H. In addition, even if the cells of the filling pattern 510 are disposed apart from one another, the level differences between the cells can be reduced. It is, however, to be understood that the present disclosure is not limited thereto. In some implementations, when the top surface of the encapsulation layer 170 is substantially flat, the bottom surface BW of the filling pattern 510 may also form a flat (or substantially flat) surface.

The filling pattern 510 may be disposed on the encapsulation layer 170 such that at least a part of it overlaps with the wavelength conversion patterns 341 and 343 and/or the light transmission pattern 345 of the second substrate 300. The light L incident on the bottom surface BW of the filling pattern 510 may pass through the filling pattern 510 to exit, to be incident on the second substrate 300. The light L incident on the second substrate 300 may be incident on the wavelength conversion patterns 341 and 343 and/or the light transmission pattern 345 of the second substrate 300 and may exit from the light-exiting area PA. At least a part of the filling pattern 510 may overlap with the wavelength conversion patterns 341 and 343 and/or the light transmission pattern 345 so that the light L passing through the filling pattern 510 can be efficiently (or suitably) incident on the wavelength conversion patterns 341 and 343 and/or the light transmitting pattern 345 of the second substrate 300.

In one or more exemplary embodiments, at least a part of the filling pattern 510 may overlap with the light-exiting area PA but not with the non-light-exiting area PB, and in one or more exemplary embodiments, the area of the top surface UW of the filling pattern 510 may be substantially equal to or larger than the area of the light-exiting area PA. According to one or more embodiments, since the filling pattern 510 is substantially disposed in the light-exiting area PA, most of the light L passing through the filling pattern 510 can be incident on the wavelength conversion patterns 341 and 343 and the light transmission pattern 345. It is, however, to be understood that the present disclosure is not limited thereto.

As the display device 10 includes the filling pattern 510 of cells disposed on the first substrate 100, it is possible to prevent or reduce color mixture of light L exiting from the light-exiting areas PA.

For example, the first cell 511 of the filling pattern 510 may be disposed such that it overlaps with the first emitting area LA1 of the first organic light-emitting element ED1. The light L exiting from the first emitting area LA1 may be incident on the bottom surface BW of the first cell 511 of the filling pattern 510. A second cell 512 of the filling pattern 510 may be disposed such that it overlaps with the second emitting area LA2 of the second organic light-emitting element ED2, and the light L exiting from the second emitting area LA2 may be incident on the bottom surface BW of the second cell 512 of the filling pattern 510.

The first cell 511 of the filling pattern 510 may be disposed such that it overlaps with the first light-exiting area PA1. The light L exiting from the first emitting area LA1 may be incident on the bottom surface BW of the first cell 511 of the filling pattern 510 and may be incident on the first wavelength conversion pattern 341 disposed in the first light-exiting area PA1 through the top surface UW of the first cell 511 of the filling pattern 510. The second cell 512 of the filling pattern 510 may be disposed such that it overlaps with the second light-exiting area PA2. The light L exiting from the second emitting area LA2 may be incident on the bottom surface BW of the second cell 512 of the filling pattern 510 and may be incident on the second wavelength conversion pattern 343 disposed in the second light-exiting area PA2 through the top surface UW of the second cell 512 of the filling pattern 510.

The light L exiting from the first emitting area LA1 and the second emitting area LA2 may be incident on the first cell 511 and the second cell 512 of the filling pattern 510, respectively. The first cell 511 of the filling pattern 510 may provide a path of the light L so that the light exiting from the first emitting area LA1 is incident on the first wavelength conversion pattern 341 not on the second wavelength conversion pattern 343. The second cell 512 of the filling pattern 510 may provide a path of the light L so that the light exiting from the second emitting area LA2 is incident on the second wavelength conversion pattern 343 not on the first wavelength conversion pattern 341. Accordingly, the filling pattern 510 can prevent or reduce the light L output from the first substrate 100 from reaching another adjacent light-exiting area PA to result in color mixture.

The length of the top surface UW of each cell of the filling pattern measured in, e.g., the first direction d1 may be equal to the length of the bottom surface BW thereof measured in the same direction. For example, the area of the top surface UW of the filling pattern 510 may be equal to that of the bottom surface BW. Accordingly, the side surface 510s of the filling pattern 510 may be perpendicular to the upper surface of the first substrate 100. The side surface 510s of the filling pattern 510 may form an interface with the filling material 520 described in more detail later and can reflect at least a part of the light L incident on the side surface 510s. Accordingly, the amount of light L incident on the second substrate 300 among the light L passing through the filling pattern 510 can be increased. It is, however, to be understood that the present disclosure is not limited thereto. In one or more embodiments, the filling pattern 510 may be disposed to cover the entire top surface of the encapsulation layer 170. A more detailed description thereon will be given below.

The cells of the filling pattern 510 are spaced apart from one another, and the height H of the filling pattern 510 (measured in a third direction d3 perpendicular and/or crossing the first direction d1) may be smaller than the thickness of the filling layer 500 measured in the third direction d3. Accordingly, there may be spaces between the cells of the filling pattern 500 and between the top surface UW of the filling pattern 510 and the second substrate 300. The spaces may be filled with the filling material 520.

The filling pattern 510 and the filling material 520 may include a light-transmitting material. The filling pattern 510 and the filling material 520 may include a light-transmitting material so that the light L output from the first substrate 100 passes through the filling layer 500 to be incident on the second substrate 300.

In addition, as described above, the filling pattern 510 may include a material having a high refractive index. The filling pattern 510 disposed between the first substrate 100 and the second substrate 300 can reduce the difference in the refractive index between them. When the light L output from the first substrate 100 passes through the filling pattern 510 to be incident on the second substrate 300, the difference between the incidence angle and the refraction angle becomes smaller with the refractive index, so that the light can be incident on the second substrate 300 efficiently.

In one or more exemplary embodiments, the filling material 520 may include a material having a lower refractive index than that of the first substrate 100 and the second substrate 300. The filling pattern 510 having a relatively large refractive index and the filling material 520 having a relatively small refractive index may be disposed in the filling layer 500. The light L output from the first substrate 100 may be incident on the second substrate 300 through the filling pattern 510 having a small refractive index difference.

In addition, there may be an interface between the side surface 510s of the filling pattern 510 and the filling material 520. The light L incident on the interface may be reflected by the difference in the refractive index and may be incident on the second substrate 300.

In one or more embodiments, the filling pattern 510 may have a height equal to the gap between the first substrate 100 and the second substrate 300 to absorb shock so that the first substrate 100 and the second substrate 300 can be coupled together reliably.

The filling pattern 510 may be formed of a silicon-based organic material, an epoxy-based organic material, and/or an epoxy-acrylic-based organic material, without limitation. The filling material 520 may be an air layer or a gas layer containing an inert gas such as nitrogen and/or argon or a variety of gas mixtures. It is, however, to be understood that the present disclosure is not limited thereto.

In one or more exemplary embodiments, the filling pattern 510 may be made of a material having a refractive index greater than 1.5 so that total reflection can occur effectively at the interface with the filling material 520.

For example, when the filling material 520 includes an air layer or a gas layer, the refractive index of the filling material 520 may be substantially close to 1.0. That is, a difference in the refractive index between the filling pattern 510 and the filling material 520 may be 0.5 or more, and the total reflection can be effectively occur at the interface between the filling pattern 510 and the filling material 520.

It is, however, to be understood that the present disclosure is not limited thereto. The filling material 520 is not particularly limited herein as long as it includes a low refractive material layer other than an air layer and the difference in the refractive index between the filling pattern 510 and the filling material 520 is 0.3 or greater. For example, the filling material 520 may be ethylhexyl acrylate, pentafluoropropyl acrylate, polyethylene glycol dimethacrylate, and/or ethylene glycol dimethacrylate, etc., without limitation. In such case, the filling material 520 can more effectively (or suitably) absorb shock between the first substrate 100 and the second substrate 300.

The filling pattern 510 according to one or more exemplary embodiments may include the same material as that in the encapsulation layer 170, and the material may be hexamethyldisiloxane (HMDSO).

The light L emitted from each of the organic layers OL1, OL2 and OL3 of the first substrate 100 may be incident on the filling layer 500 through the common electrode CE and the encapsulation layer 170. If there is no filling pattern 510 and only the filling material 520 having a low refractive index in the filling layer 500, the light L is reflected at the boundary between the encapsulation layer 170 and the filling layer 500, such that the light extraction efficiency may be lowered. In addition, if the filling pattern 510 includes a material different from the encapsulation layer 170, the path of the light L emitted from the first substrate 100 may be changed or reflected depending on the difference in the refractive index. As a result, the intensity of light emitted from the second substrate 300 may be reduced or color mixture may occur.

In contrast, when the filling pattern 510 includes the same material as the encapsulation layer 170, the light L output from the first substrate 100 can travel from the encapsulation layer 170 to be incident on the filling pattern 510 almost without being refracted. Accordingly, most of the light L output from the first substrate 100 can be incident on the second substrate 300, and the amount of the light L incident on the adjacent other light-exiting area PA can be reduced, thereby preventing or reducing color mixture. In one or more embodiments, the filling pattern 510 may be formed by forming the encapsulation layer 170 and performing a continuous process. A more detailed description thereon will be given below.

The filling pattern 510 according to one or more exemplary embodiments of the present disclosure may include a first pattern part 510a having curve portion GP formed in at least a portion thereof.

As described above, when the filling pattern 510 includes a material having a high refractive index, e.g., the same material as the encapsulation layer 170, the light emitted from the organic light-emitting elements ED may be hardly refracted and may be incident on the filling pattern 510. As shown in the drawings, the filling material 520 may be disposed between the top surface UW of the filling pattern 510 and the second substrate 300, and the light L may be reflected at the interface between the top surface UW of the filling pattern 510 and the filling material. When this happens, the light extraction efficiency of the light L output from the first substrate 100 may be somewhat reduced.

According to one or more exemplary embodiments of the present disclosure, the filling pattern 510 includes the first pattern part 510a having the curve portion GP formed therein so that the light incident on the filling pattern 510 can be scattered by the curve portion GP. The light L incident on the curve portion GP of the filling pattern 510 at a certain incidence angle may be scattered, and the scattered light L' may not be finally reflected off the top surface UW of the filling pattern 510 but may be incident on the second substrate 300.

In the drawing, the filling pattern 510 includes only the first pattern part 510a. In other words, the curve portion GP may be formed on the entire portion of the filling pattern 510 in some implementations. It is, however, to be understood that the present disclosure is not limited thereto. As will be described in more detail later, the filling pattern 510 may further include a second pattern part 510b with no curve portion GP on the first pattern part 510a.

The first pattern part 510a has the curve portion GP formed at least in a part thereof. The curve portion GP can scatter the light L incident at a certain incidence angle so that the light L has a number of refraction angles. In the drawing, the curve portion GP are formed only on the top surface of the filling pattern 510 or the first pattern part 510a. It is, however, to be understood that the present disclosure is not limited thereto. Curve portion GP may be partially formed on the side surface 510s of the first pattern part 510a or inside thereof.

The curve portion GP may be formed as a material reacts with the material of the first pattern part 510a to form another material layer when the first pattern part 510a is formed. For example, the material of the curve portion GP may be different from the material of the other portion of the first pattern part 510a or the material of the second pattern part 510b. A more detailed description thereon will be given later.

Hereinafter, paths of the light L emitted from the organic light-emitting elements ED will be described with reference to FIGS. 8 to 10.

Figure 8:
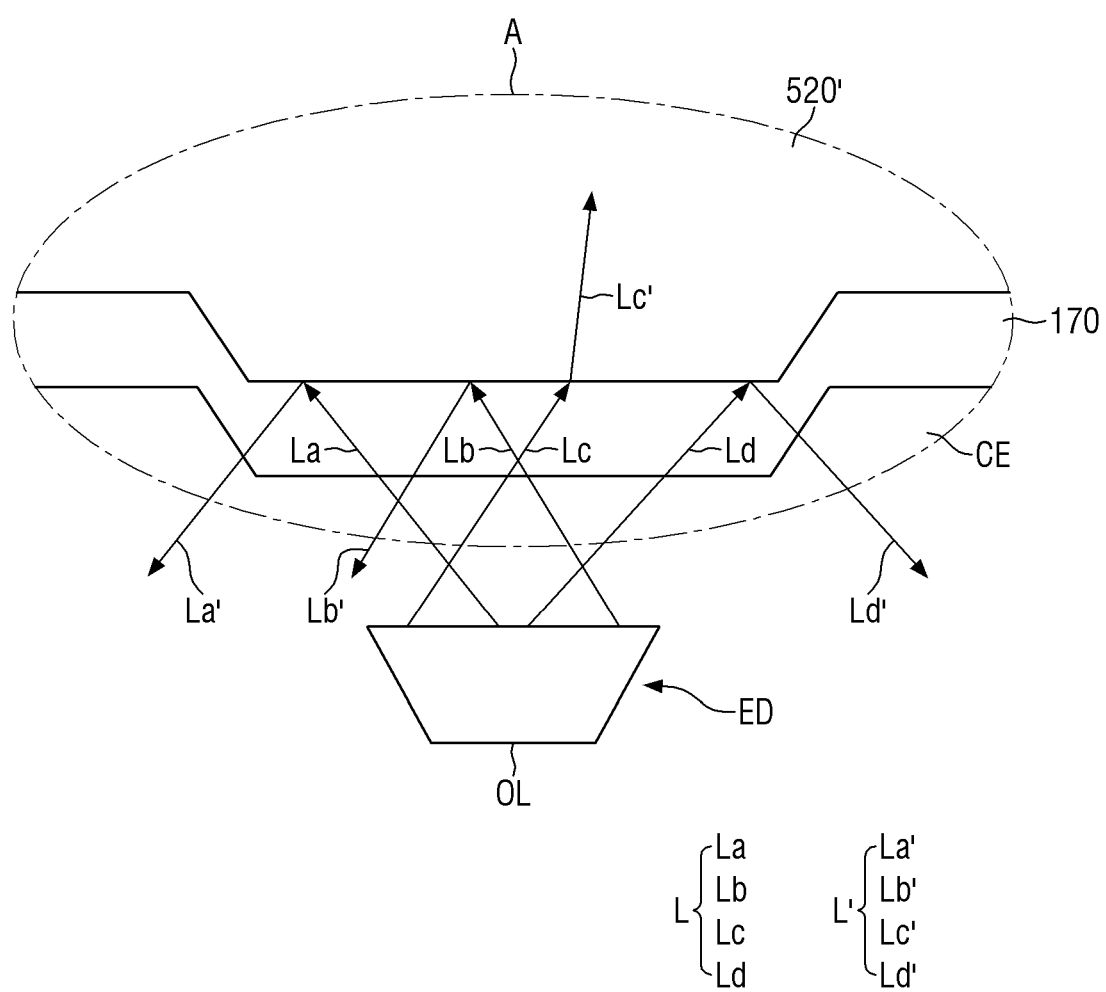
FIG. 8 is an enlarged view for illustrating light paths in a display device according to Comparative Example.

FIG. 8 is an enlarged view for illustrating light paths in a display device according to Comparative Example. FIGS. 9 and 10 are enlarged views for illustrating light paths in area A of FIG. 4.

Referring initially to FIG. 8, if there is no filling pattern formed on the first substrate 100, the encapsulation layer 170 may form an interface with the filling material 520, for example, an air layer. In such case, most of the light L emitted from the organic light-emitting elements ED can be incident on the air layer from the encapsulation layer 170 and travel toward the second substrate 300. However, a relatively large number of the lights L cannot be incident on the air layer but may be reflected. For example, when a first light La, a second light Lb, a third light Lc and a fourth light Ld are emitted from an organic light-emitting element ED, the first light La, the second light Lb and the fourth light Ld may not be incident on the air layer having a lower refractive index than the encapsulation layer 170 but may be reflected (lights La', Lb' and Ld' in FIG. 8). Only the third light Lc may be refracted at the interface between the encapsulation layer 170 and the air layer and travel through (light Lc' in FIG. 8). According to this Comparative Example, even though the first to fourth lights La, Lb, Lc and Ld are emitted from the organic light-emitting element ED, only the third light Lc can pass through the air layer and be incident on the second substrate 300.

Figure 9:
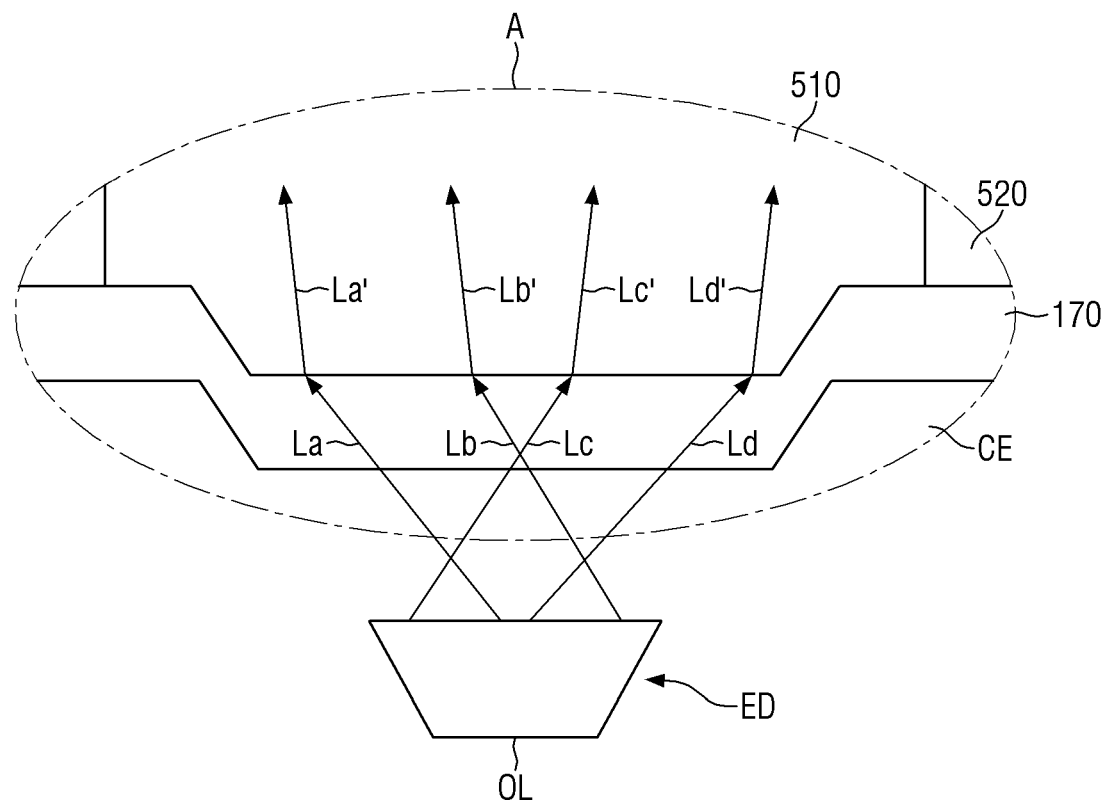
FIGS. 9 and 10 are enlarged views for illustrating light paths in area A of FIG. 4.

In contrast, referring to FIG. 9, if there is the filling pattern formed on the first substrate 100, the encapsulation layer 170 may form an interface with the filling pattern 510. Then, the first to fourth lights La, Lb, Lc and Ld emitted from the organic light-emitting element ED can be incident on the filling pattern 510 substantially without being refracted at the interface. When the filling pattern 510 includes a material having a small difference in the refractive index with the encapsulation layer 170 or a material having substantially the same refractive index, the lights La, Lb, Lc and Ld emitted from the organic light-emitting elements ED can be incident on the filling pattern 510 efficiently.

Figure 10:
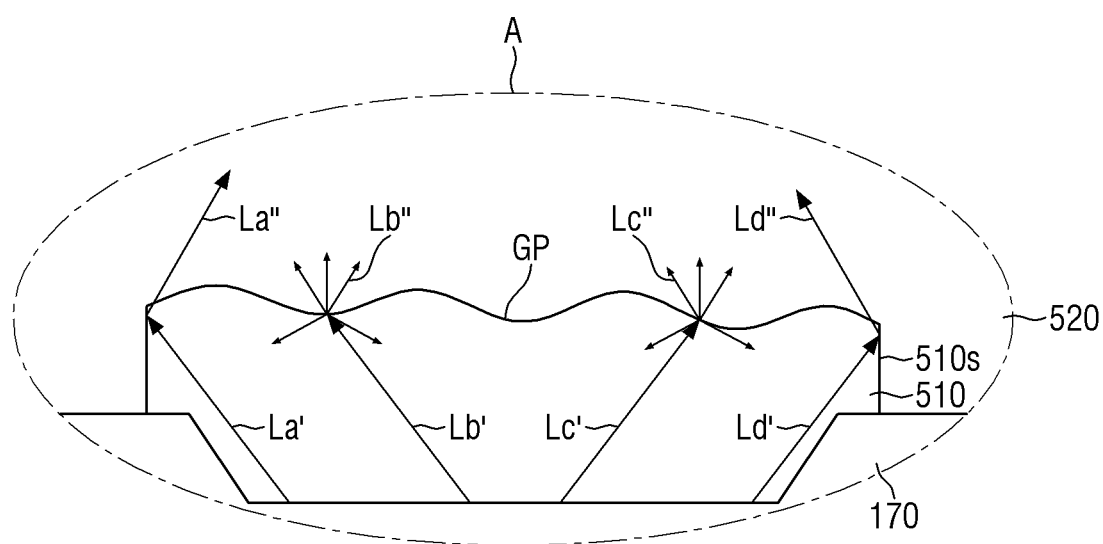

Referring next to FIG. 10, lights La', Lb', Lc' and Ld' in FIG. 9 refracted at the interface between the filling pattern 510 and the encapsulation layer 170 may pass through the filling pattern 510 and may be incident on the interface between the filling pattern 510 and the filling material 520. Among them, the first light La' and the fourth light Ld' incident on the side surface 510s where the curve portion GP is not formed in the filling pattern 510 may meet the filling material 520 having a low refractive index to be reflected at the interface (La" and Ld" in FIG. 10). The reflected first light La" and reflected fourth light Ld" may be incident on the second substrate 300 through the curve portion GP of the filling pattern 510. Specifically, when the cells of filling patterns 510 are disposed on the encapsulation layer 170 such that they are spaced apart from one another, the light L' reflected at the interface with the filling material 520 interposed between the cells may travel toward the upper side of the filling pattern 510. Accordingly, the light L emitted from one of the organic light-emitting elements ED, e.g., from the first organic light-emitting element ED1 may be reflected at the side surface 510a of the filling pattern 510, such that it may be incident on the first wavelength conversion pattern 341, not on the second wavelength conversion pattern 343.

Meanwhile, the second light Lb' and the third light Lc' incident on the curve portion GP of the filling pattern 510 may be scattered at the curve portion GP (lights Lb "and Lc" in FIG. 10). A part of the scattered second light Lb" and the third light Lc" may be incident on the filling material 520, and the other part of them may be reflected back to the filling pattern 510. As can be seen from FIG. 10, the filling pattern 510 including a material having a small difference in refractive index with the encapsulation layer 170 and having the curve portion GP can transmit more lights L to the second substrate 300 than the filling pattern according to Comparative Example shown in FIG. 8. In addition, when no curve portion GP is formed on the top surface UW of the filling pattern 510, at least a part of the light L passing through the filling pattern 510 may be reflected again. The curve portion GP of the filling pattern 510 may scatter at least a part of the reflected light L' and transmit the scattered light to the second substrate 300. Accordingly, the filling pattern 510 including the first pattern part 510a having the curve portion GP formed thereon can increase the amount of the light L emitted from the organic light-emitting elements ED and incident on the second substrate 300. In addition, as described above, since the cells of the filling pattern 510 are spaced apart from one another, it is possible to prevent or reduce color mixture of light L emitted from the organic light-emitting elements ED.

According to one or more exemplary embodiments of the present disclosure, when the filling pattern 510 includes hexamethyldisiloxane, the curve portion GP may be formed by reacting the hexamethyldisiloxane with molecules containing nitrogen, and the curve portion GP may contain nitrogen.

When the filling pattern 510 includes an organic material, e.g., hexamethyldisiloxane, it may have relatively flexible properties. As will be described later, during processes of fabricating the display device 10, in order to form the filling pattern 510 on the encapsulation layer 170, a hexamethyldisiloxane precursor may be injected concurrently or simultaneously with the molecules containing nitrogen. The precursor may be deposited on the encapsulation layer 170 to react with the molecules containing nitrogen, such that the surface in the first pattern part 510a may be partially curved. Compared to the hexamethyldisiloxane, which is an organic material, the precursor reacts with nitrogen to be partially cured, and the cured portion may be curved. Accordingly, as the precursor reacts with the nitrogen, some portions are curved to form the curve portion GP. As a result, the content of nitrogen in the first pattern part 510a can be increased.

According to one or more exemplary embodiments of the present disclosure, the content of nitrogen in the first pattern part 510a of the filling pattern 510 may be larger than the content of nitrogen in the second pattern part 510b. The curve portion GP containing nitrogen may be formed at the first pattern part 510a and not at the second pattern part 510b. When the filling pattern 510 is formed on the encapsulation layer 170, the molecules containing nitrogen may be injected when the first pattern part 510a is formed but not when the second pattern part 510b is formed. The content of nitrogen in the filling pattern 510 may be larger in the first pattern part 510a than in the second pattern part 510b.

When the precursor is deposited, the molecules containing nitrogen may not be injected into the second pattern part 510b or a very small amount of the molecules may be injected into it. Unlike the first pattern part 510a, the second pattern part 510b may have a relatively flat surface on the first pattern part 510a including hexamethyldisiloxane because there is almost no region where the precursor reacts with nitrogen to be cured. In addition, the second pattern part 510b including the organic material may have viscosity and adhesive force as compared with the first pattern part 510a, so that the second substrate 300 can be reliably attached. A more detailed description thereon will be given later.

The curve portion GP according to one or more exemplary embodiments of the present disclosure includes at least one convex portion protruding upwardly and at least one concave portion protruding downwardly with respect to the straight line connecting one end with the opposite end thereof. The convex portion and the concave portion may be curved portions having a predetermined (or set) curvature formed by the curve portion GP of the first pattern part 510a.

It is to be understood that in the curve portion GP of the first pattern part 510a, the ratio and shape of the convex portion and the concave portion may vary. For example, the gap between the convex portions of the curve portion GP, i.e., the cycle of the curve portion GP, may affect the degree to which the incident light L is scattered. The shorter the cycle of the curved portion GP is, the larger the scattering angle of the incident light L is, and the amount of light directed to the second substrate 300 can be increased. In one or more exemplary embodiments, the gap between the convex portions of the curve portion GP, i.e., the cycle of the curve portion GP, may range from 0.5 to 1.5 μm, The curve portion GP having the cycle of the above range can efficiently (or suitably) provide light to the second pattern part 510b and the second substrate 300 by scattering light incident on the first pattern part 510a.

Figure 11:
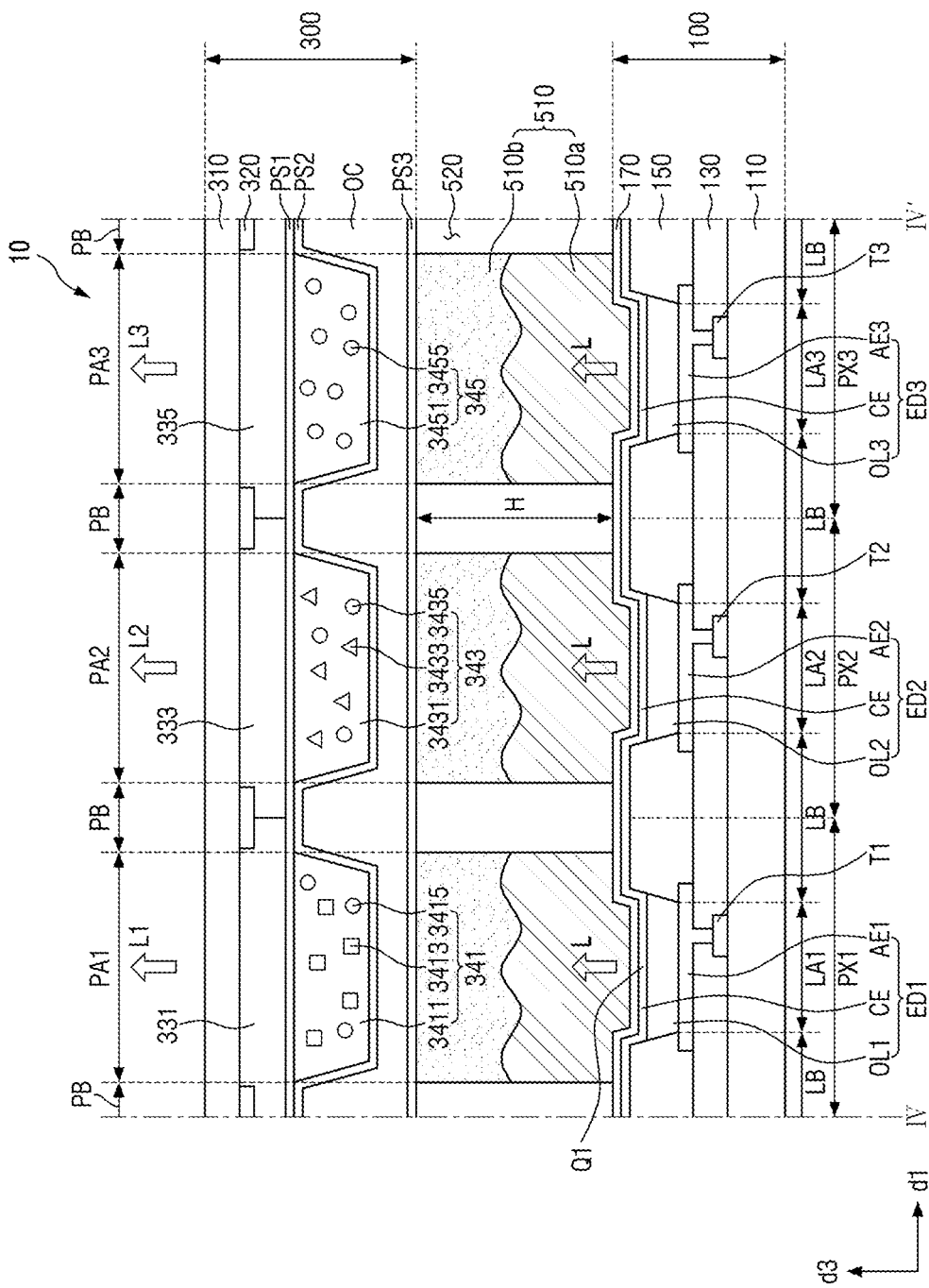
FIG. 11 is a cross-sectional view of a display device according to another exemplary embodiment of the present disclosure, taken along line IV-IV' of FIG. 3.

FIG. 11 is a cross-sectional view of a display device according to another exemplary embodiment of the present disclosure, taken along line IV-IV' of FIG. 3.

As described above, the filling pattern 510 according to an exemplary embodiment of the present disclosure may further include the second pattern part 510b with no curve portion GP on the first pattern part 510a. The second pattern part 510b may include substantially the same material as the first pattern part 510a, for example, hexamethyldisiloxane (HMDSO), and can reduce the difference in the refractive index between the first pattern part 510a and the second substrate 300.

Referring to FIG. 11, the filling pattern 510 of the display device 10 may further include the first pattern part 510a and the second pattern part 510b disposed on the first pattern part 510a. The second pattern part 510b does not have the curve portion GP and the light L scattered at the curve portion GP of the first pattern part 510a can be incident thereon. The second pattern part 510b may provide paths of the scattered light L so that the scattered light L may be incident on the second substrate 300.

The second pattern part 510b may be extended (positioned) on the first pattern part 510a. The side surface of the second pattern part 510b may be aligned with that of the first pattern part 510a, to form the side surface 510s of the filling pattern 510. Accordingly, the cross-sectional shape of the filling pattern 510 may be substantially rectangular.

The second pattern part 510b may be disposed on the first pattern part 510a so that the top surface of the second pattern part 510b may be in contact with the second substrate 300. For example, the height H' of the filling pattern 510 including the second pattern part 510b may be equal to the thickness of the filling layer 500. Accordingly, the filling material 520 used to fill the space between the cells of the filling pattern 510 spaced apart from one another may substantially form a pattern in the filling layer 500. The filling pattern 510 includes the second pattern layer 510b so that the bottom surface and the top surface of the filling pattern 510 may be in contact with the first substrate 100 and the second substrate 300, respectively. The filling pattern 510 can absorb shock so that the second substrate 300 can be reliably attached to the first substrate 100.

Figure 12:
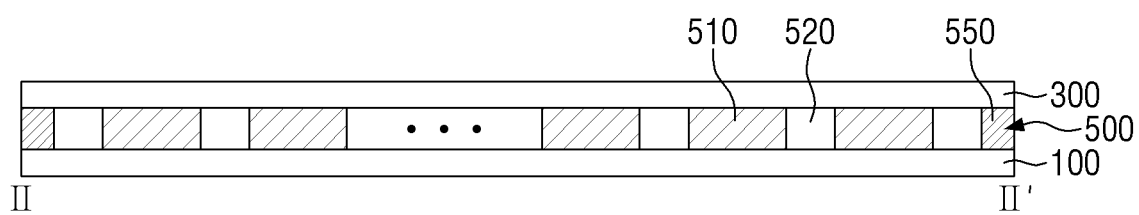
FIG. 12 is a cross-sectional view of a display device according to another exemplary embodiment of the present disclosure, taken along line II-II' of FIG. 1.

FIG. 12 is a cross-sectional view of a display device according to another exemplary embodiment of the present disclosure, taken along line II-II' of FIG. 1.

Referring to FIG. 12, it can be seen that the region filled with the filling material 520 forms a pattern, unlike that shown in FIG. 2. In the exemplary embodiment shown in FIG. 2, the filling pattern 510 includes only the first pattern part 510a, and accordingly the space between the top surface of the first pattern part 510a and the second substrate 300 may also be filled with the filling material 520. On the other hand, in the exemplary embodiment shown in FIG. 12, the filling pattern 510 includes the first pattern part 510a and the second pattern part 510b, and accordingly the top surface of the filling pattern 510 is in contact with the second substrate 300. Accordingly, the space between the filling pattern 510 and the second substrate 300 is not filled with the filling material 520, but the space between the cells of the filling pattern 510 is filled with the filling material 520. That is, the filling material 520 may form a pattern in the filling layer 500.

The second pattern part 510b may include the same material as the first pattern part 510a, but may have no curve portion GP. Accordingly, the light L' incident on the curve portion GP formed at the boundary between the first pattern part 510a and the second pattern part 510b is scattered, and most of the scattered light L" may travel to the second pattern part 510a.

Figure 13:
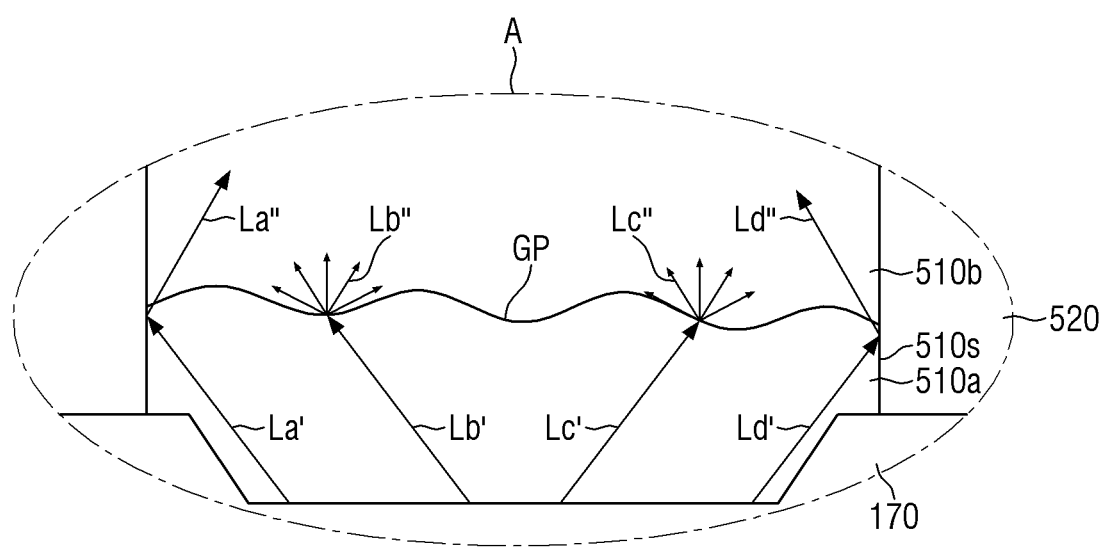
FIG. 13 is an enlarged view for illustrating light paths in area A of FIG. 11.

FIG. 13 is an enlarged view for illustrating light paths in area A of FIG. 11.

Referring to FIG. 13, unlike in the embodiment of FIG. 10, the second pattern part 510b may be further disposed on the first pattern part 510a. A second light Lb' and a third light Lc' emitted from an organic light-emitting element ED and incident on the curve portion GP of the first pattern part 510a may be scattered. The first pattern part 510a and the second pattern part 510b may include the same material and have the same refractive index or almost same refractive indices. Accordingly, the second light Lb" and the third light Lc" scattered at the curve portion GP can be scattered while maintaining the traveling direction. That is, a larger number of scattered second light Lb" and third light Lc" may travel to the second pattern layer 510b compared with the exemplary embodiment shown in FIG. 10. The light incident on the second pattern layer 510b may be incident on the second substrate 300. Since the difference in the refractive index between the second substrate 300 and the second pattern layer 510b is small, most of the light can be incident on the second substrate 300. As a result, the light extraction efficiency of the display device 10 can be improved.

The second pattern part 510b includes substantially the same material as the first pattern part 510a, they can be formed in a continuous process. As described above, however, the first pattern part 510a may be formed by injecting a certain injection gas so that the gas reacts with the material of the first pattern part 510a to form the curve portion GP. On the other hand, no gas is injected to for the second pattern part 510b and thus no curve portion GP is formed thereon.

In one or more embodiments, during the process of fabricating the filling pattern 510, the first pattern part 510a may be formed by simultaneously injecting the precursor material of the filling pattern 510 along with the injection gas, while the second pattern part 510b may be formed by injecting only the precursor material on the pattern part 510a. Accordingly, the filling pattern 510 may have different contents of the injection gas in the first pattern part 510a and the second pattern part 510b. A more detailed description thereon will be given later.

As described above, the encapsulation layer 170 is not limited to the structure shown in FIG. 4. In some embodiments, the encapsulation layer 170 may be made up of multiple layers, and the top surface may be substantially flat.

Figure 14:
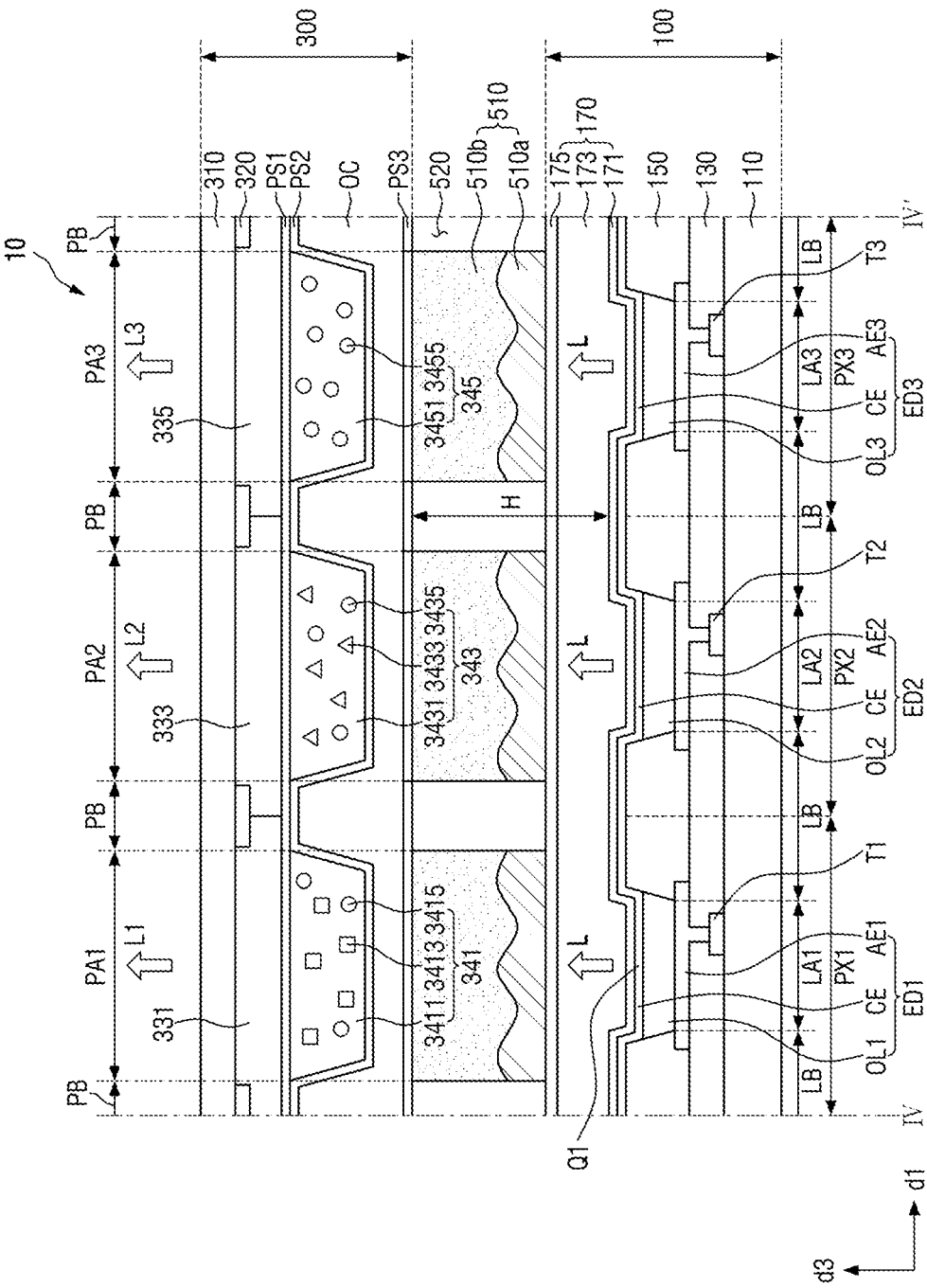
FIG. 14 is a cross-sectional view of a display device according to another exemplary embodiment of the present disclosure, taken along line IV-IV' of FIG. 3.

FIG. 14 is a cross-sectional view of a display device according to another exemplary embodiment of the present disclosure, taken along line IV-IV' of FIG. 3.

Referring to FIG. 14, an encapsulation layer 170 according to an exemplary embodiment of the present disclosure may include a first inorganic encapsulation layer 171, an organic encapsulation layer 173 and a second inorganic encapsulation layer 175 stacked on one another in this order above the cathode electrode CE.

The first inorganic encapsulation layer 171 is disposed on the common electrode CE of the organic light-emitting element ED. The first inorganic encapsulation layer 171 is disposed along the common electrode CE on which a step or concavo-convex pattern is formed. Accordingly, the first inorganic encapsulation layer 171 may have substantially the same shape as the common electrode CE. The first inorganic encapsulation layer 171 may be disposed to cover the common electrode CE to protect it.

The organic encapsulation layer 173 is disposed on the first inorganic encapsulation layer 171. The organic encapsulation layer 173 is disposed to cover the first inorganic encapsulation layer 171 and may be formed thicker than the first inorganic encapsulation layer 171. The organic encapsulation layer 173 containing an organic material is disposed to cover the first inorganic encapsulation layer 171 on which a step or concavo-convex pattern is formed, and may have a substantially flat top surface. For example, the organic encapsulation layer 173 may cover the level difference of the first inorganic encapsulation layer 171. The second inorganic encapsulation layer 175 is disposed on the organic encapsulation layer 173. The second inorganic encapsulation layer 175 may form a flat surface along the top surface of the organic encapsulation layer 173. The encapsulation layer 170 of FIG. 14 may have substantially flat top surface, unlike the encapsulation layer 170 of FIG. 4. Accordingly, the filling pattern 510 disposed on the encapsulation layer 170 has a flat bottom surface, such that it can support the second substrate 300 stably when the first substrate 100 and the second substrate 300 are attached together.

Each of the first inorganic encapsulation layer 171 and the second inorganic encapsulation layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and/or the like.

The organic encapsulation layer 173 may be made of acrylic resin, methacrylic resin, polyisoprene, vinyl resin, epoxy resin, urethane resin, cellulose resin and/or perylene resin. It is, however, to be understood that the present disclosure is not limited thereto.

Hereinafter, some processing steps (acts) of a method of fabricating the display device 10 of FIG. 14 will be described with reference to FIGS. 15 to 18. The second substrate 300 of the display device 10 is identical to that of other exemplary embodiments described above. The first substrate 200 that includes the encapsulation layer 170 having multiple layers according to the exemplary embodiment shown in FIG. 14 will be described as an example. In the following description, a method for forming the filling layer 500 of the display device 10 will be described in more detail, and configuration and structure of the other elements will not be provided again.

FIGS. 15 to 18 are cross-sectional views for illustrating some processing steps (acts) of the method of fabricating the display device of FIG. 14.

The method for fabricating the display device 10 may include preparing a first substrate 100, forming a filling pattern layer 510' on the first substrate 100, and patterning at least a portion of the filling pattern layer 510' to form a filling pattern 510.

Figure 15:
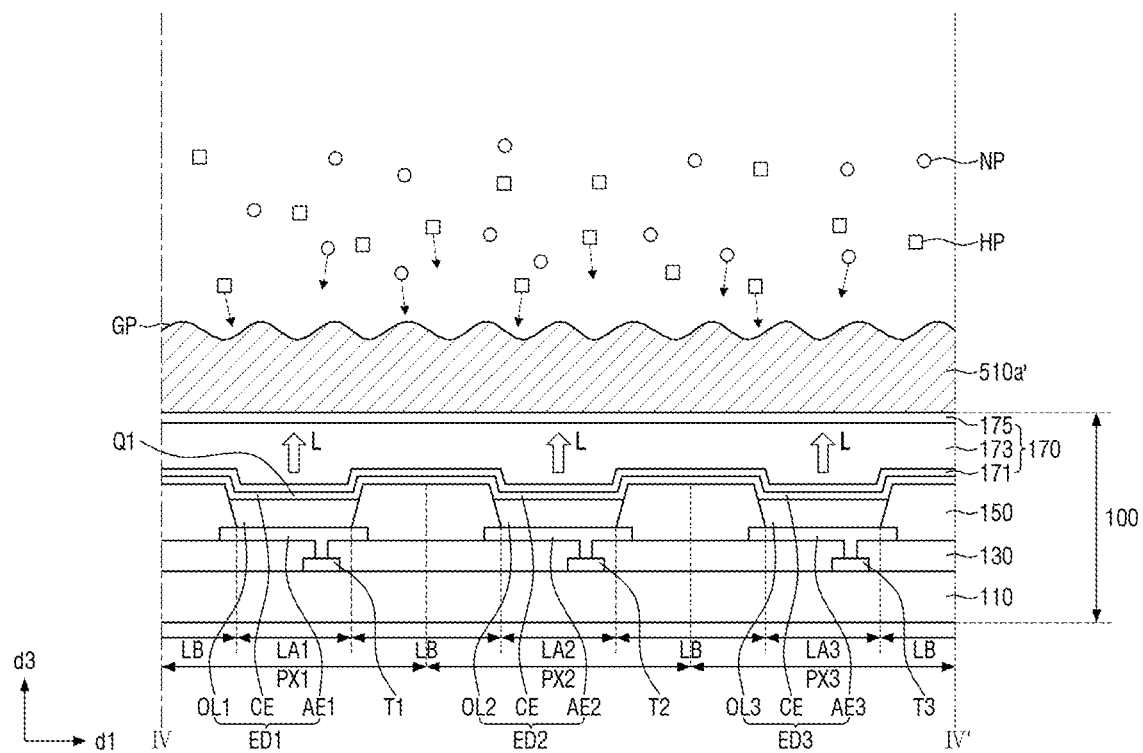
FIGS. 15 to 18 are cross-sectional views for illustrating some processing steps (acts) of the method of fabricating the display device of FIG. 14.
Figure 16:
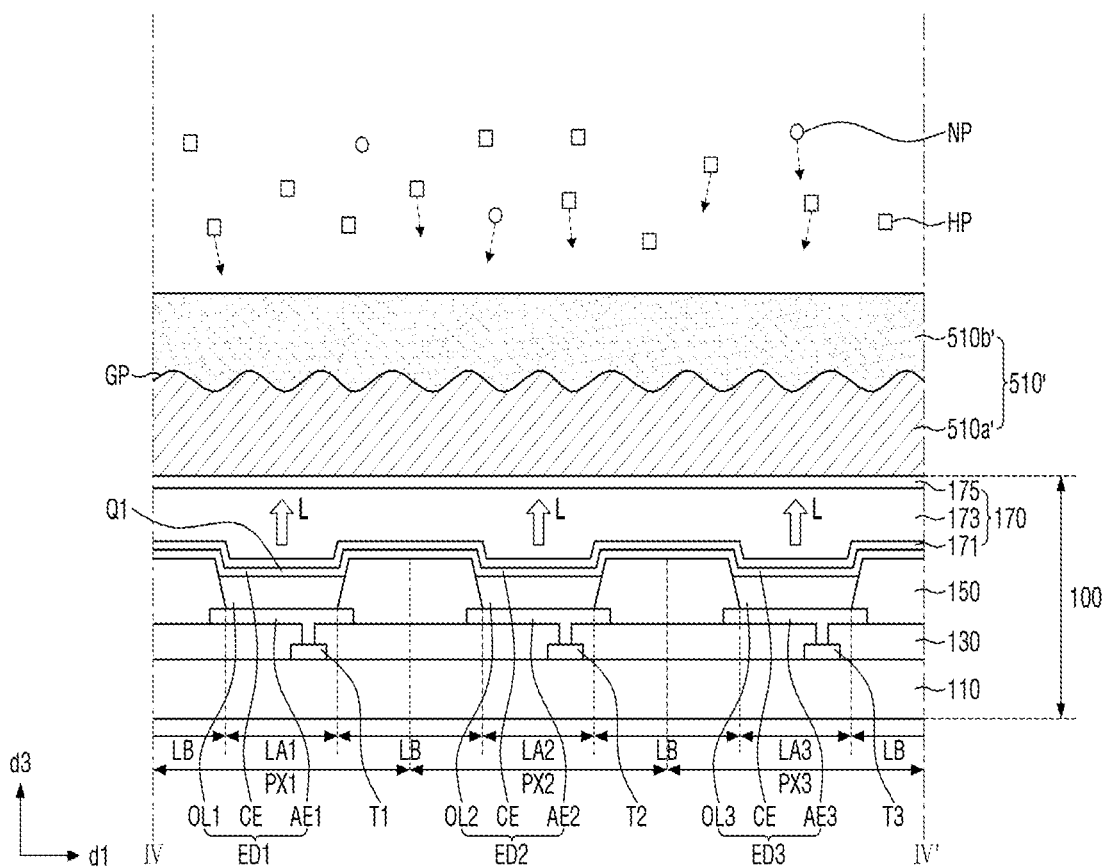

Initially, referring to FIGS. 15 and 16, the first substrate 100 is prepared, and the filling pattern 510 is formed on the first substrate 100. The first substrate 100 may include an encapsulating layer 170 including a plurality of layers, like in FIG. 14. It is, however, to be understood that the present disclosure is not limited thereto. In the first substrate 100, a single encapsulation layer 170 may be formed on the common electrode CE of the organic light-emitting elements ED1, ED2 and ED3 as shown in FIG. 4.

The forming the filling pattern layer 510' on the encapsulation layer 170 of the first substrate 100 may include forming a first pattern layer 510a' including curve portion GP formed in at least a part thereof, and forming a second pattern layer 510b' with no curve portion GP on the first pattern layer 510a'.

Initially, the first pattern layer 510a' is formed on the encapsulation layer 170. The first pattern layer 510a' may be formed on the entire surface of the encapsulation layer 170 to cover it. The second pattern layer 510b' is formed on the first pattern layer 510a' to cover it, thereby forming the filling pattern layer 510'.

In the drawings, the encapsulation layer 170 has a substantially flat top surface with substantially no level difference, and thus the bottom surface of the first pattern layer 510a' has a substantially flat surface. It is, however, to be understood that the present disclosure is not limited thereto. Even when a level difference is formed on the encapsulation layer 170, as in the display device 10 of FIG. 4, for example, the first pattern layer 510a' may cover it. Accordingly, the bottom surface of the first pattern layer 510a' may have a step or a concave/convex pattern conforming to the shape of the encapsulation layer 170.

The first pattern layer 510a' and the second pattern layer 510b' may be formed by photolithography, inkjet process, and/or chemical vapor deposition (CVD) technique. It is, however, to be understood that the present disclosure is not limited thereto.

As described above, the first pattern part 510a and the second pattern part 510b may include substantially the same material, and thus the first pattern layer 510a' and the second pattern layer 510b' may be formed via a continuous process. It should be noted that the first pattern layer 510a' and the second pattern layer 510b' can be distinguished from each other depending on whether an injection gas is injected together with precursor materials or not.

In one or more exemplary embodiments, the first pattern layer 510a' and the second pattern layer 510b' may include hexamethyldisiloxane (HMDSO) and may be formed by chemical vapor deposition (CVD) technique. The first pattern layer 510a' may be formed by injecting hexamethyldisiloxane (HMDSO) precursor HP together with nitrous oxide (N20) NP. The second pattern layer 510b may be formed by injecting hexamethyldisiloxane (HMDSO) precursor HP.

In one or more embodiments, the first pattern part 510a and the second pattern part 510b may include hexamethyldisiloxane, and they may be formed by chemical vapor deposition (CVD) technique. As described above, the curve portions GP formed in the first pattern part 510a may be formed as silicon (Si) and nitrogen (N) of the hexamethyldisiloxane (HMDSO) precursor HP react such that a part of them is cured. That is, the curve portion GP of the first pattern part 510a may partially include silicon nitride (SiN) containing nitrogen (N).

When forming the first pattern layer 510a', the hexamethyldisiloxane (HMDSO) precursor HP may be disposed on the encapsulation layer 170 and may partially react with the nitrous oxide NP injected together. The hexamethyldisiloxane precursor HP may react with nitrous oxide NP to form silicon nitride, and the silicon nitride may form curve portion GP on the first pattern layer 510a'.

As the silicon nitride (which is an inorganic material) is formed when the hexamethyldisiloxane (which is an organic material) is deposited, the silicon nitride can form a relatively firm surface compared to hexamethyldisiloxane having flowability. The hexamethyldisiloxane is partially cured by the silicon nitride, and the cured portions may be formed to be curved. As a result, curve portion GP may be formed on at least a part of the first pattern layer 510a'. The first pattern layer 510a' may include a higher content of nitrogen than the second pattern layer 510b' described later. The nitrogen may be included in the curve portion GP formed on the first pattern layer 510a'.

Subsequently, as shown in FIG. 16, a hexamethyldisiloxane precursor HP is deposited on the first pattern layer 510a' to form a second pattern layer 510b'. When the second pattern layer 510b' is formed, almost no nitrous oxide NP is injected. Unlike the first pattern layer 510a', no portion of the second pattern layer 510b' is cured, and thus no curve portion GP is formed. As a result, the second pattern layer 510b' may form a relatively flat surface, and may include hexamethyldisiloxane (which is an organic material) to exhibit viscosity and adhesive force. As described above, the content of nitrogen is higher in the first pattern layer 510a' than in the second pattern layer 510b'.

Subsequently, referring to FIGS. 17 and 18, the filling pattern layer 510' is patterned to form a filling pattern 510. The filling pattern layer 510' may be patterned by using a suitable mask M. It is, however, to be understood that the present disclosure is not limited thereto.

Figure 17:
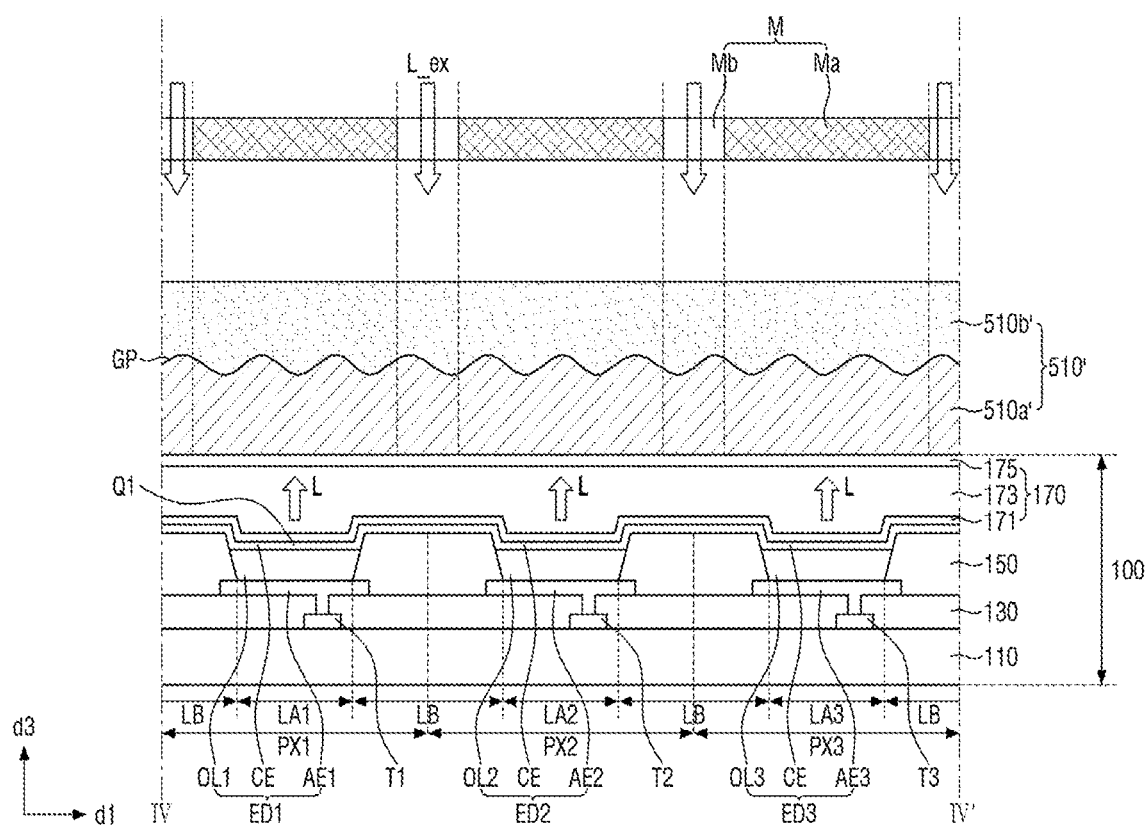
Figure 18:
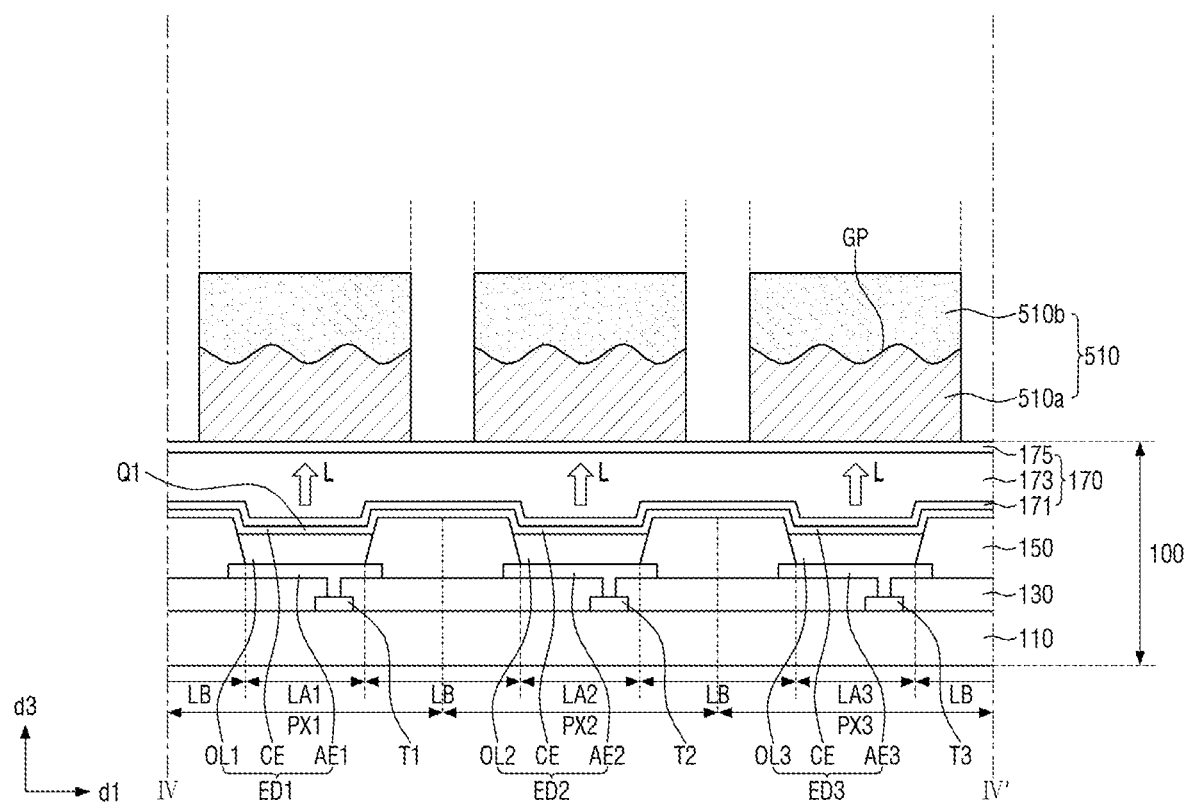

Initially, as shown in FIG. 17, the mask M may be placed above and aligned with the first substrate 100. The mask M may include a light-blocking portion Ma for blocking all light and a light-transmitting portion Mb for transmitting all light. The light-blocking portion Ma may overlap the organic light-emitting elements ED1, ED2 and ED3 of the first substrate 100. The cross-sectional area of the light-blocking portion Ma may be equal to the cross-sectional area of the light-exiting areas PA1, PA2 and PA3. The light-transmitting portion Mb may overlap with the bank layer 150 of the first substrate 100. The cross-sectional area of the light-transmitting portion Mb may be equal to the cross-sectional area of the non-light-exiting area PB.

As described in more detail later, the filling pattern 510 may be formed below the region where the filling pattern layer 510' overlaps with the light-blocking portion Ma. That is, the shape of the filling pattern 510 may vary depending on the light-blocking portion Ma. In order to form the filling pattern 510 of cells spaced apart from one another, the light-blocking portion Ma is comprised of parts that are spaced apart from one another, and the light-transmitting portion Mb may be positioned between them. It is, however, to be understood that the present disclosure is not limited thereto.

When forming the filling pattern 510, an exposure light L_ex may be irradiated onto the first substrate 100 from above the mask M. A part of the exposure light L_ex is blocked by the light-blocking portion Ma of the mask M, and the other exposure light L_ex passes through the light-transmitting portion Mb to be irradiated onto the filling pattern layer 510a' on the first substrate 100. For example, the exposure light L_ex may be selectively irradiated onto the filling pattern layer 510a' by the mask M.

In the portion of the filling pattern layer 510a' onto which the exposure light L_ex is selectively irradiated through the light-transmitting portion Mb, the polymer bondings may be broken. Consequently, the portion of the filling pattern layer 510a' irradiated with the exposure light L_ex can be removed via a subsequent process. The portion which is below the light-transmitting portion Mb and is irradiated with the exposure light L_ex is removed via a subsequent process, while the other portion which is not irradiated with the exposure light L_ex may not be removed and form the filling pattern 510, as shown in FIG. 18.

Accordingly, the shape of the filling pattern 510 can be adjusted by adjusting the light-blocking portion Ma and the light-transmitting portion Mb of the mask M. As described above, the size, position, etc. of the filling pattern 510 can be adjusted by adjusting the position and diameter of the light-transmitting portion Mb of the mask M. In the drawings, the light-blocking portion Ma overlaps with the organic light-emitting elements ED and forms the same cross-sectional area as that of the light-exiting areas PA1, PA2 and PA3. In such case, since the portion of the filling pattern layer 510' below the light-blocking portion Ma is not removed and forms the filling pattern 510, the filling pattern 510 overlaps with the organic light-emitting elements ED and may have the same cross-sectional area as the light-exiting areas PA1, PA2 and PA3. It is, however, to be understood that the present disclosure is not limited thereto.

The shapes of the light-blocking portion Ma and the light-transmitting portion Mb of the mask M are not limited to the shapes shown in the drawings and may vary so as to adjust the position, size, and/or shape of the filling pattern 510 and/or the like. For example, although the filling pattern 510 having a substantially rectangular shape is shown in the drawings, the filling pattern 510 may have inclined side surfaces.

The portion of the filling pattern layer 510' that is removed by the light irradiated through the light-transmitting portion Mb of the mask M may be filled with the filling material 520. For example, the filling material 520 may be an air layer as described above, but is not limited thereto. The removed portion may be filled with a material having a lower refractive index than that of the filling pattern 510.

Subsequently, the filling pattern 510 is formed on the first substrate 100, and then the first substrate 100 is attached to the second substrate 300, thereby fabricating the display device 10. During the process of attaching the first substrate 100 to the second substrate 300, the space between the cells of the filling pattern 510 is filled with the filling material 510, and the first substrate 100 is coupled to the second substrate 300 by the sealing member 550, thereby fabricating the display device 10.

Figure 19:
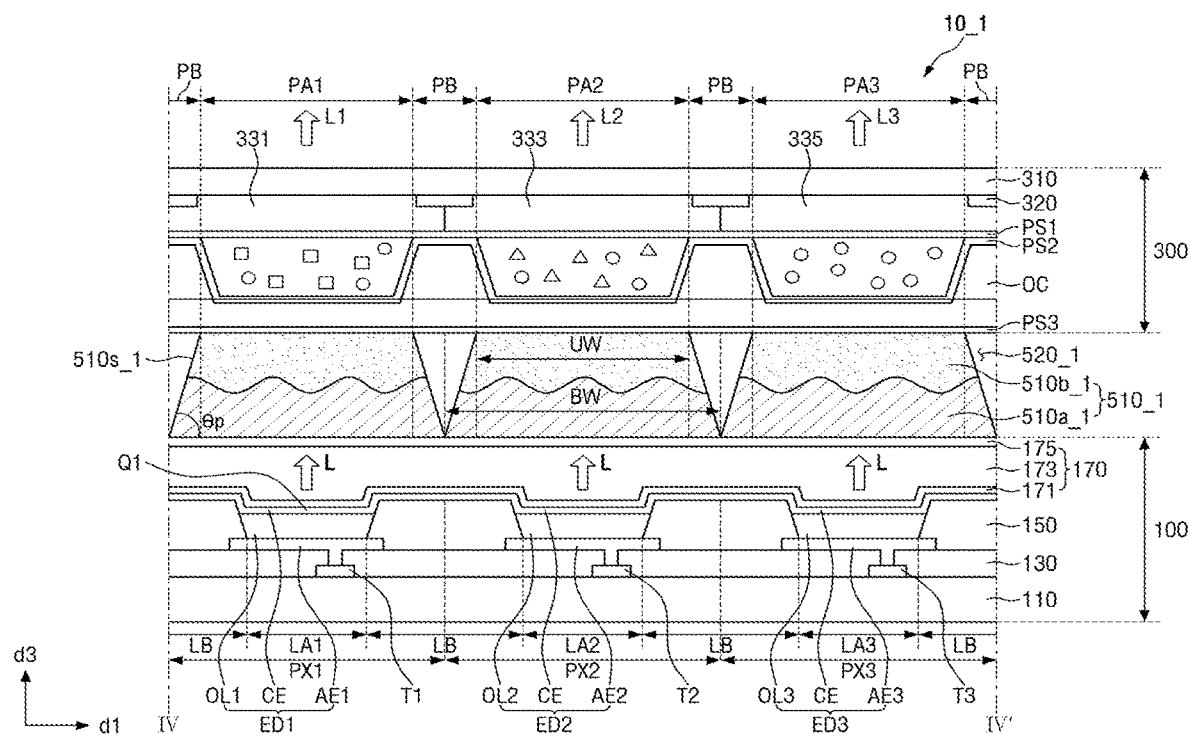
FIGS. 19 to 22 are cross-sectional views of display devices according to other exemplary embodiments of the present disclosure, taken along line IV-IV' of FIG. 3.
Figure 20:
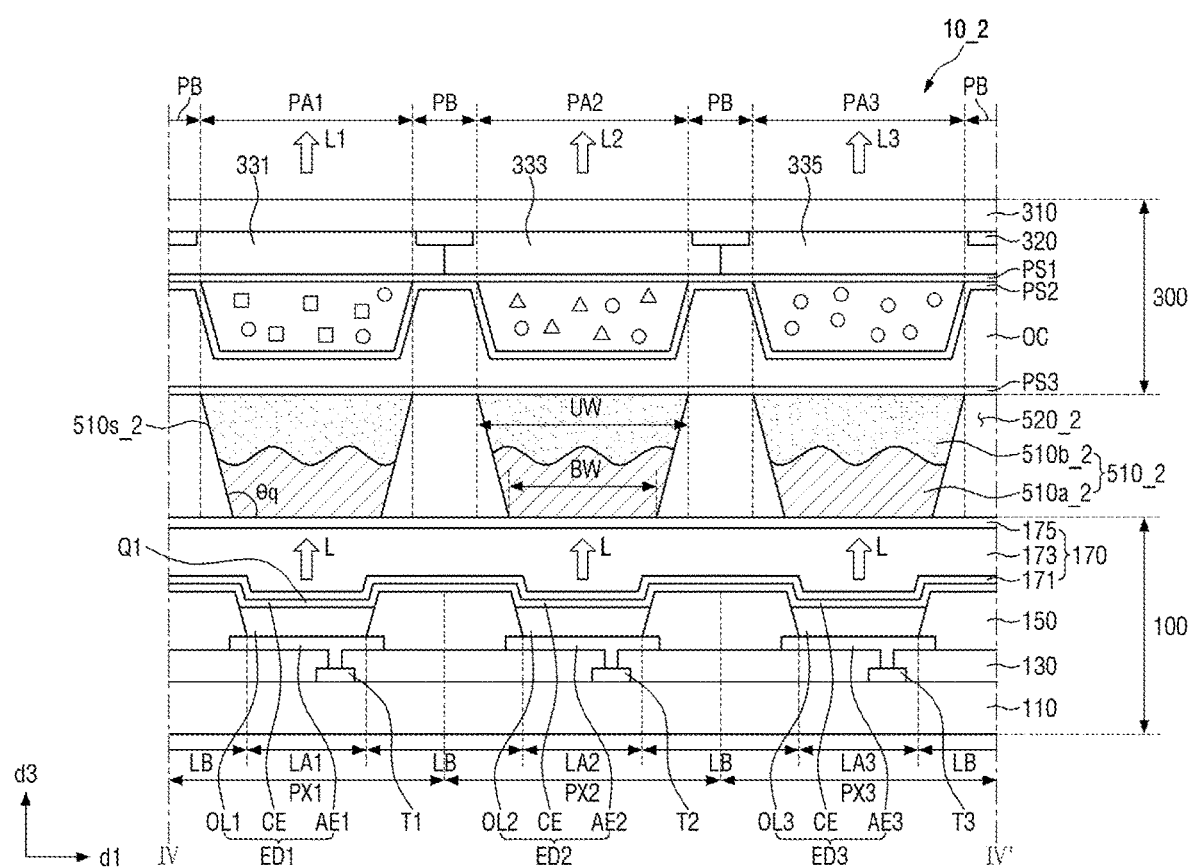
Figure 21:
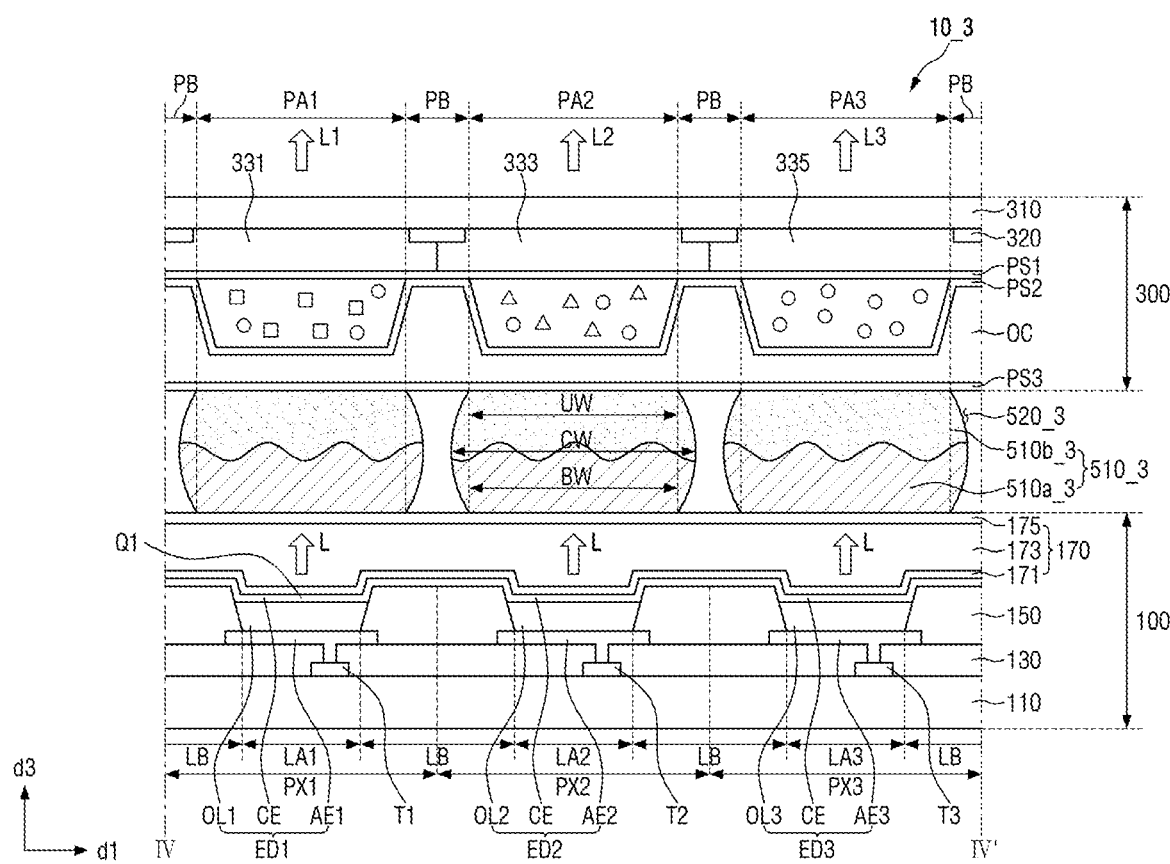

Hereinafter, filling patterns according to a variety of exemplary embodiments will be described with reference to FIGS. 19 to 21. Display devices of FIGS. 19 to 21 are substantially identical to the display device 10 of FIG. 14 except that filling patterns have different structures. Therefore, descriptions will be made focusing on differences, and the redundant descriptions will not be provided again.

FIGS. 19 to 21 are cross-sectional views of display devices according to a variety of exemplary embodiments of the present disclosure, taken along line IV-IV' of FIG. 3.

As described above, the shape of the filling pattern 510 is not limited to that shown in FIG. 4 or 14. The side surfaces of the filling pattern 510 are not necessarily perpendicular to the first substrate 100 and may be inclined toward one side or may protrude outward with a predetermined (or set) curvature in one or more embodiments.

In one or more exemplary embodiments, the side surfaces of the filling pattern 510 may be inclined, so that the upper and lower surfaces of the filling pattern 510 may have different lengths measured in one direction.

Referring to FIG. 19, a filling pattern 510_1 of a display device 10_1 may be formed such that the length BW of the bottom surface measured in the first direction d1 is larger than the length UW of the top surface, and the side surface 510s_1 is inclined. Accordingly, the angle $\theta_p$ formed by the first substrate 100 and the side surfaces 510s_1 of the filling pattern 510_1 may be an acute angle smaller than 90 degrees. That is, the filling pattern 510_1 may have a trapezoidal shape with its bottom surface BW longer than its top surface UW.

As described above, the area of the top surface UW of the filling pattern 510_1 may be substantially equal to or greater than the area of each of the light-exiting areas PA1, PA2 and PA3. The light L output from the first substrate 100 may pass through the filling pattern 510 and may be incident on the second substrate 300 through the top surface UW. The light L can be efficiently (or suitably) incident on the plurality of wavelength conversion patterns 341 and 343 and the light transmission pattern 345 because the area of the top surface UW is equal to or greater than that of the light-exiting areas PA.

The area of the bottom surface BW of the filling pattern 510_1 may not be equal to the area of each of the light-exiting areas PA1, PA2 and PA3. In FIG. 19, the area of the bottom surface BW of the filling pattern 510_1 is greater than the area of each of the light-exiting areas PA1, PA2 and PA3. For example, the side surface 510s_1 of the filling pattern 510_1 may be inclined toward the inside of the filling pattern 510_1 from the bottom surface BW to the top surface UW. The angle $\theta_p$ formed by the side surfaces 510s_1 of the filling pattern 510_1 and the first substrate 100 may be an acute angle (less than 90 degrees). In such case, a larger amount of light L can be incident on the bottom surface BW of the filling pattern 510_1.

The bottom surface BW of the filling pattern 510_1 may be in contact with the bottom surface BW of another adjacent filling pattern 510_1. The space between adjacent filling patterns 510_1 may become larger toward the top surface UW and may be filled with the filling material 520_1. The light L incident through the relatively wide bottom surface BW may be reflected at the boundary between the filling material 520_1 and the filling pattern 510_1 and may be incident on the second substrate 300.

Referring to FIG. 20, a filling pattern 510_2 of a display device 10_2 may be formed such that the length BW of the bottom surface measured in the first direction d1 is smaller than the length UW of the top surface, and the side surface 510s_2 is inclined. Accordingly, the angle $\theta_q$ formed by the first substrate 100 and the side surfaces 510s_2 of the filling pattern 510_2 may be an obtuse angle (greater than 90 degrees). For example, the filling pattern 510_2 may have an inverted trapezoidal shape with its bottom surface BW shorter than its top surface UW.

The area of the bottom surface BW of the filling pattern 510_2 may be smaller than the area of each of the light-exiting areas PA1, PA2 and PA3. The area of the bottom surface of the filling pattern 510_2 may be greater than the area of each of the emitting areas LA1, LA2 and LA3 of the organic light-emitting elements ED so that the light incident on the first substrate 100 does not escape. The angle by which the light L emitted from the organic light-emitting elements ED is incident on the side surface 510s_2 of the filling pattern 510_2 may become larger when the angle $\theta_q$ formed by the first substrate 100 and the side surfaces 510s_2 of the filling pattern 510_2 is an obtuse angle greater than 90 degrees. Accordingly, a larger amount of the light L may be totally reflected at the boundary between the filling pattern 510_2 and the filling material 520_2 and incident on the second substrate 300.

Unlike the display device 10 of FIG. 4, the filling patterns according to the exemplary embodiments of FIGS. 19 and 20 have the bottom surface BW and the top surface UW of different lengths and an inclined side surface, so that a larger amount of the light L can be incident on the second substrate 300.

Referring to FIG. 21, a filling pattern 510_3 has substantially the same lengths of the top surface UW and the bottom surface BW measured in one direction, e.g., in the first direction d1, and a portion of each cell of the filling pattern 510_3 between the top surface UW and the bottom surface BW may protrude into the space between the adjacent cells. For example, at least a part of the side surface 510s_3 of the filling pattern 510_3 may protrude toward the outside of the filling pattern 510_3.

As a part of the side surface 510s_3 of the filling pattern 510_3 protrudes, the outer surface may be partially bent with a certain (set) curvature. The shape of the protruding side surface 510s_3 of the filling pattern 510_3 may be formed during the process of attaching the first substrate 100 and the second substrate 300 together. It is, however, to be understood that the present disclosure is not limited thereto.

It is to be understood that the light-blocking member 320 of the second substrate 300 is not limited to the shape shown in FIG. 4. In some embodiments, the light-blocking member 320 may be made of one or more layers, and may further include another light-blocking member disposed between the plurality of wavelength conversion patterns 341 and 343 and the light transmitting patterns 345.

Figure 22:
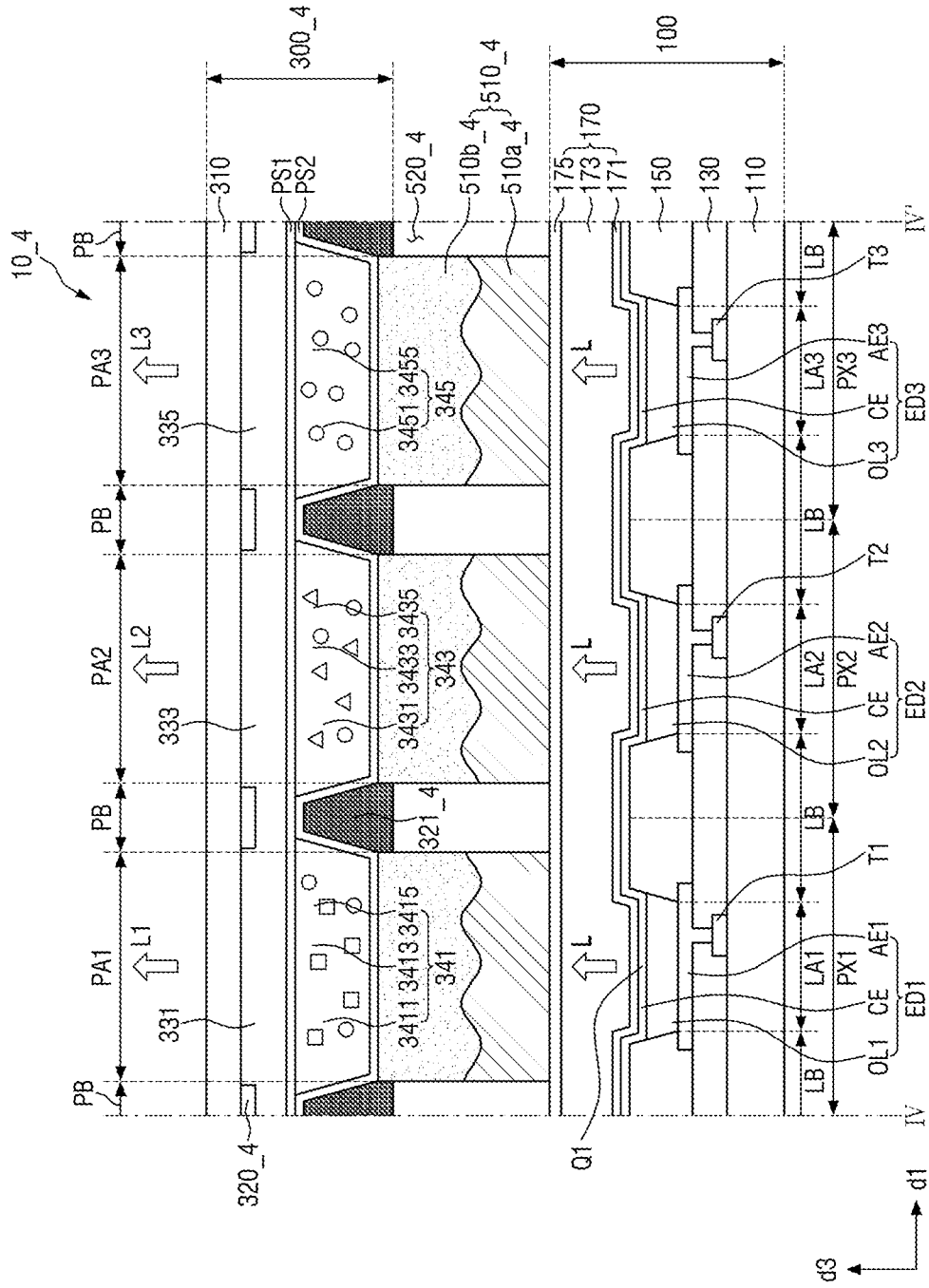

FIG. 22 is a cross-sectional view of a display device according to another exemplary embodiment of the present disclosure, taken along line IV-IV' of FIG. 3.

A display device 10_4 shown in FIG. 22 is different from the display device shown in FIG. 14 in that a second substrate has a different structure. The planarization layer OC and the third capping layer PS3 may not be included in the second substrate 300_4, and the second substrate 300_4 may further include a subsidiary light-blocking member 321_4 disposed in the space between the wavelength conversion patterns 341 and 343 and the light transmission pattern 345. The subsidiary light-blocking member 321_4 may be disposed in the space between the wavelength conversion patterns 341 and 343 and the light transmission pattern 345 so that the space is filled with it.

Specifically, referring to FIG. 22, the display device 10_4 further includes a light-blocking member 320_4 disposed on the second base 310 and a subsidiary light-blocking member 321_4. The subsidiary light-blocking member 321_4 is disposed on the second capping layer PS2 between the wavelength conversion patterns 341 and 343 and the light transmission pattern 345. The subsidiary light-blocking member 321_4 may be located in the non-light-exiting area PB and not in the first light-exiting area PA1, the second light-exiting area PA2 and the third light-exiting area PA3. For example, the subsidiary light-blocking member 321_4 may be formed in a lattice pattern when viewed from the top and can prevent or reduce color mixture which occurs when light crosses over the adjacent light-exiting areas PA1, PA2 and PA3. The thickness of the subsidiary light-blocking member 321_4 may be, but is not limited to being, larger than the thickness of each of the wavelength conversion patterns 341 and 343 and the light transmission pattern 345.

The subsidiary light-blocking member 321_4 can absorb or reflect light of all colors and block or reduce transmission. The subsidiary light-blocking member 321_4 may be formed in a lattice pattern when viewed from the top and can prevent or reduce color mixture which occurs when light crosses over the adjacent light-exiting areas PA1, PA2 and PA3.

The subsidiary light-blocking member 321_4 may be disposed on the second capping layer PS2. The second capping layer PS2 may be made of a material including an inorganic material. In one or more exemplary embodiments, however, the second capping layer PS2 may include silicon oxynitride (SiON). When the second capping layer PS2 includes silicon oxynitride (SiON), it can be attached to the subsidiary light-blocking member 321_4 more stably and can spread well (suitably). The subsidiary light-blocking member 321_4 may be made of the same material as the light-blocking member 320_4, but this is merely illustrative.

In one or more exemplary embodiments, a capping layer may be further disposed on the subsidiary light-blocking member 321_4. The capping layer may be disposed entirely on the second substrate 300 to cover the subsidiary light-blocking member 321_4 and the second capping layer PS2, but this is merely illustrative. The capping layer may cover the subsidiary light-blocking member 321_4 only.

When the second substrate 300_4 of the display device 10_4 does not include the planarization layer OC as shown in FIG. 22, it may be advantageous in that the thickness of the display device 10_4 can be reduced. The subsidiary light-blocking member 321_4 that can block or reduce light may be disposed between the wavelength conversion patterns 341 and 343 and the light transmission pattern 345, instead of the planarization layer that can transmit light, so that the overall height of the second substrate 300_4 can be made uniform. In the display device 10_4 from which the planarization layer OC and the third capping layer PS3 have been eliminated, the top surface of the filling pattern 510_4 may be in direct contact with the wavelength conversion patterns 341 and 343 and the light transmission pattern 345 of the second substrate 300.

In one or more embodiments, the subsidiary light-blocking member 321_4 can block the light exiting through the side surfaces of the wavelength conversion patterns 341 and 343 and the light transmission pattern 345 to prevent or reduce the color mixture between the light-exiting areas PA1, PA2 and PA3 more effectively.

The subsidiary light-blocking member 321_4 may be disposed in the space between the cells of the filling pattern 510_4 of the filling layer 500. For example, the bottom surface of the subsidiary light-blocking member 321_4 may be in contact with the filling material 520_4, and a part of the side surface may be in contact with the filling pattern 510_4. As the subsidiary light-blocking member 321_4 disposed between the wavelength conversion patterns 341 and 343 and the light transmission pattern 345 is partially brought into contact with the filling pattern 510_4, a part of the light incident on the second substrate 300 from the filling pattern 510_4 can be blocked or reduced.

For example, when a part of the light L emitted from the first organic light-emitting element ED1 is not reflected at the boundary between the filling pattern 510_4 and the filling material 520_4 but is incident on the second wavelength conversion pattern 343, the subsidiary light-blocking member 321_4 can block or reduce the light L. Thus, unlike the display device 10 of FIG. 4, the display device 10_4 of FIG. 22 may include the subsidiary light-blocking member 321_4 that can partially block or reduce the light incident on the wavelength conversion patterns 341 and 343 and the light transmission pattern 345 to prevent or reduce color mixture more effectively.

As described above, the space between the cells of the filling pattern 510 of the filling layer 500 may be filled with the filling material 520. The cells of the filling pattern 510 may be arranged on the first substrate 100 at different suitable spacings in different suitable shapes. Hereinafter, the shape of the filling pattern 510 when viewed from the top will be described in more detail.

Figure 23:
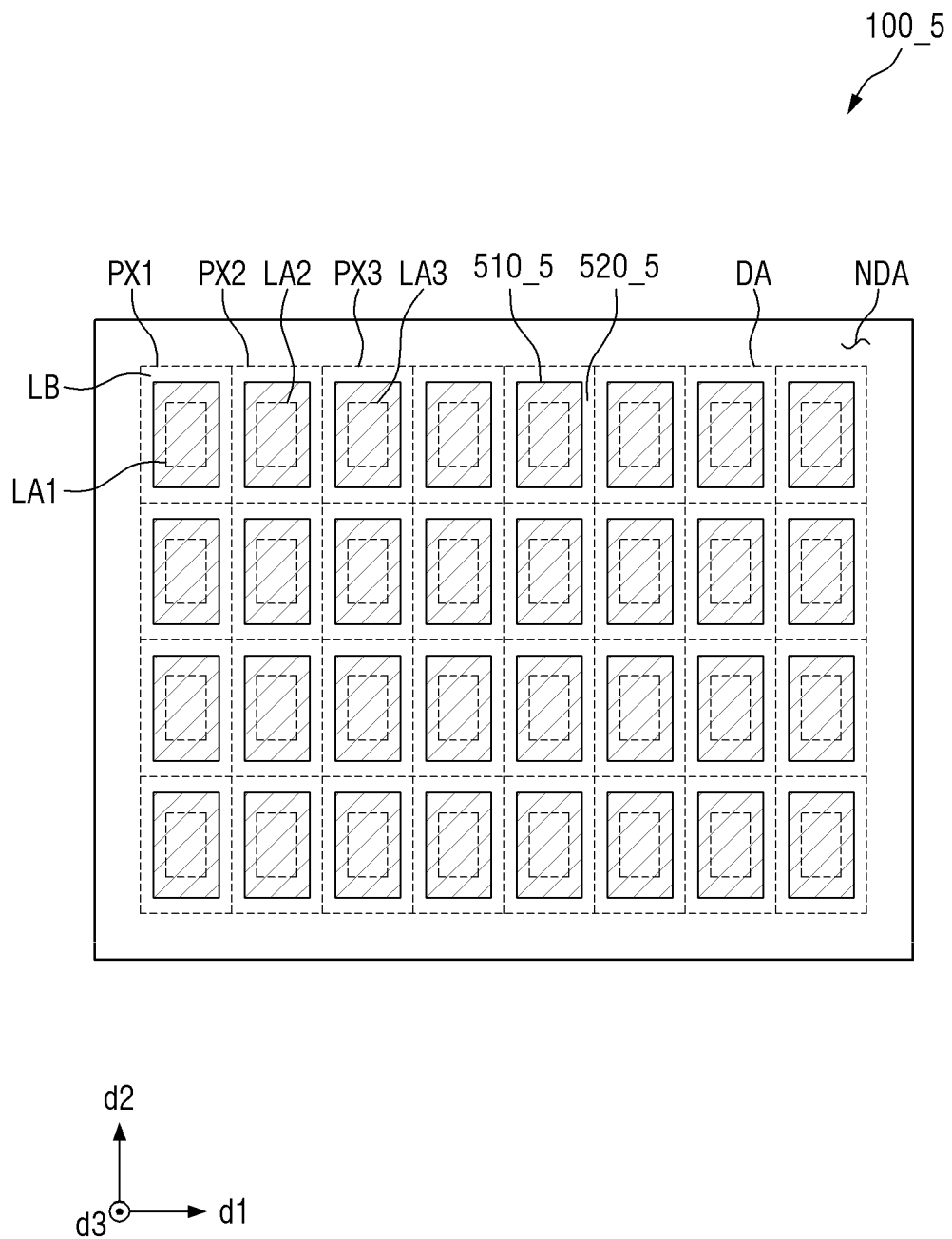
FIGS. 23 to 25 are schematic plan views of first substrates and filling patterns formed on the first substrates according to a variety of exemplary embodiments.
Figure 24:
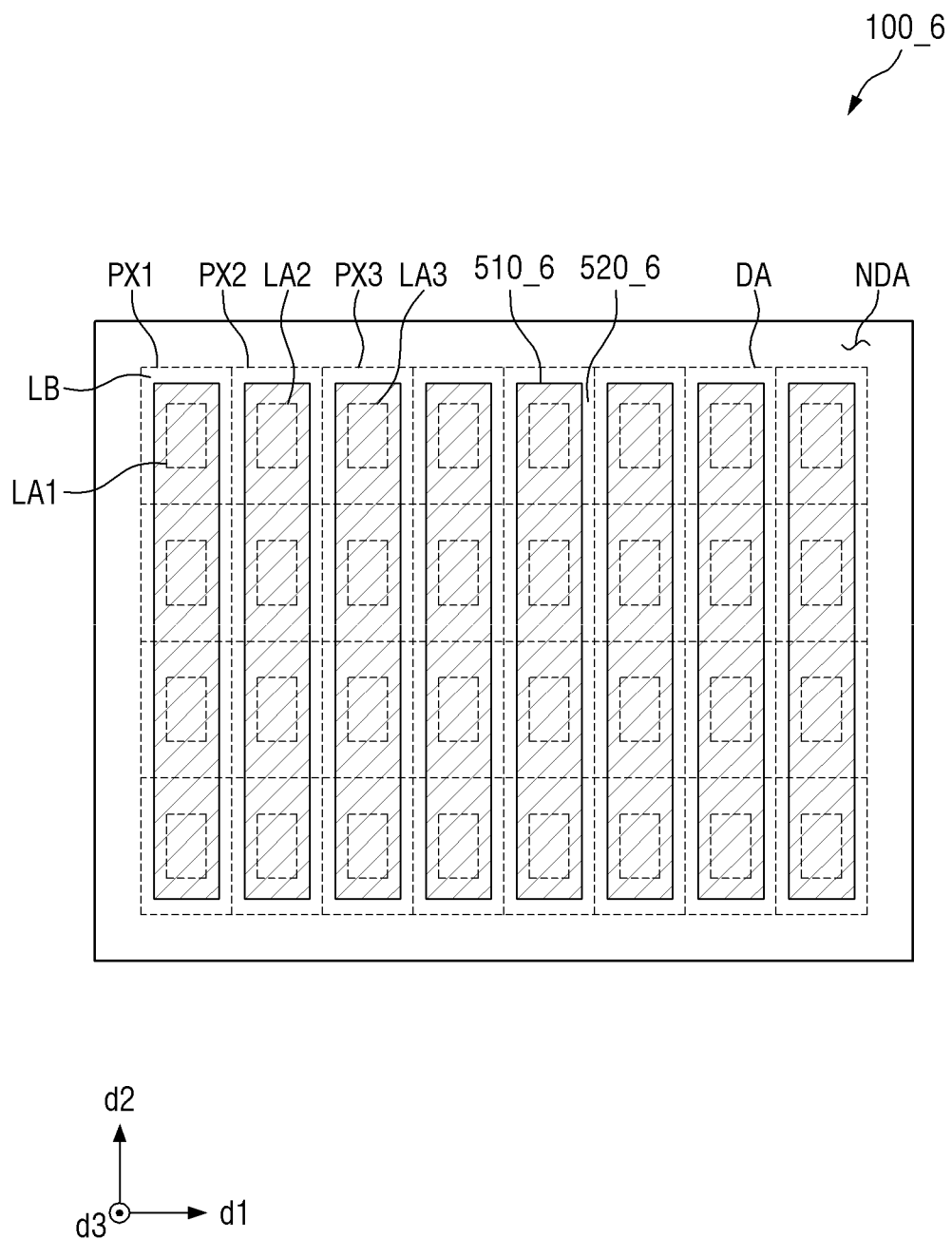
Figure 25:
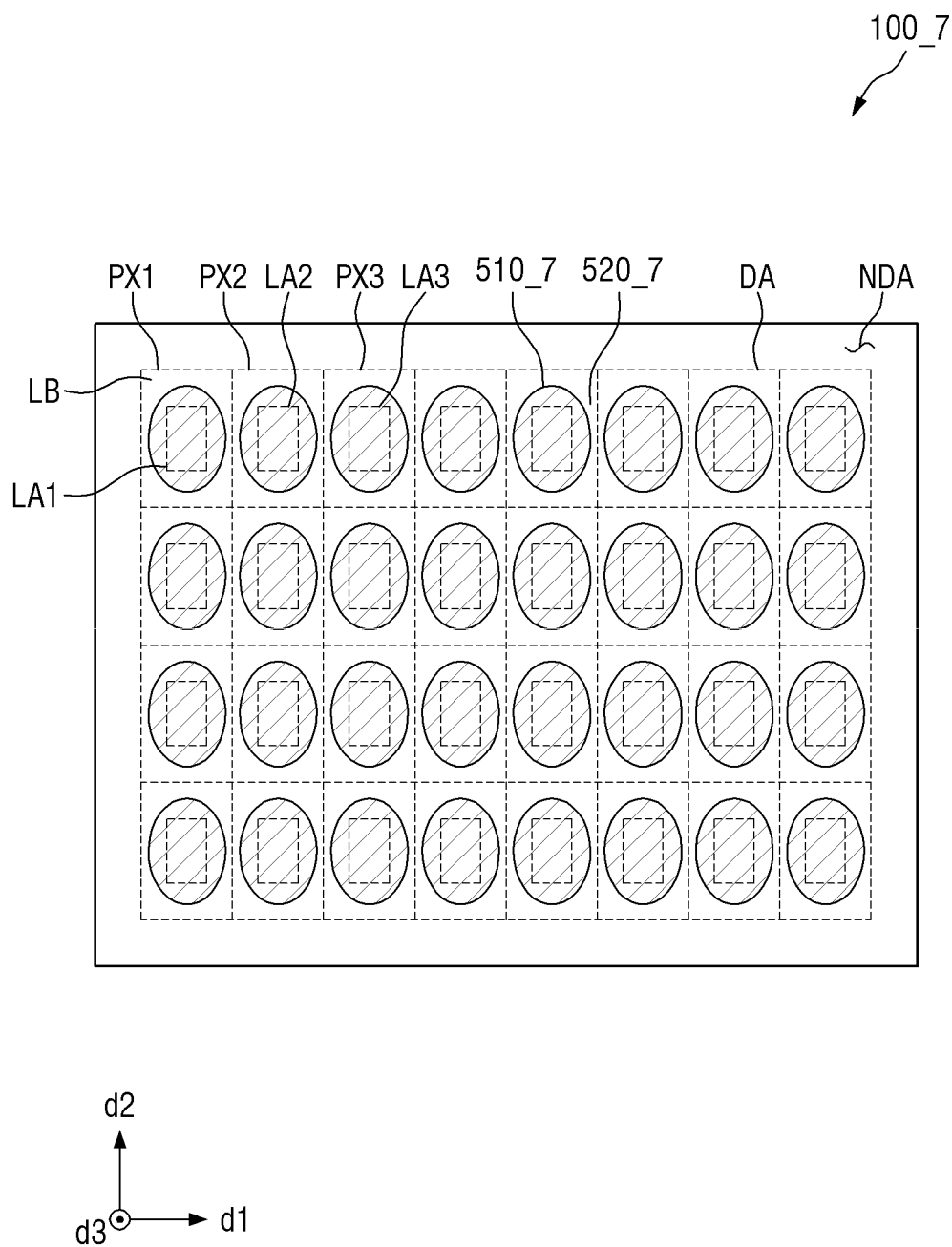

FIGS. 23 to 25 are schematic plan views of first substrates and filling patterns formed on the first substrates according to a variety of exemplary embodiments.

Referring to FIG. 23, each cell of the filling pattern 510_5 may be formed in the respective pixels PX1, PX2 and PX3 on a first substrate 100_5. The filling pattern 510_5 may include cells adjacent to one another in the first direction d1 and spaced apart from one another in the second direction d2. For example, the filling pattern 510_5 may have a substantially rectangular shape when viewed from the top, and may be disposed on the first substrate 100 in an island shape or a lattice pattern. It is, however, to be understood that the present disclosure is not limited thereto.

Each of cells of the filling pattern 510_5 may be included in the respective pixels PX1, PX2 and PX3 to cover the emitting areas LA1, LA2 and LA3 and may be spaced apart from one another. For example, the area of each cell of the filling pattern 510_5 may be smaller than that of the pixels PX1, PX2 and PX3 but may be larger than the respective emitting areas LA1, LA2 and LA3 when viewed from the top.

A filling material 520_5 may be disposed on the first substrate 100 between the cells of the filling pattern 510_5 that are spaced apart from one another. As described above, when the height of the filling pattern 510_5 is equal to the thickness of the filling layer 500, the filling material 520_5 may substantially form a pattern as well. Accordingly, the filling material 520_5 may include a portion extended in the first direction d1 and a portion extended in the second direction d2 to surround the filling pattern 510_5 The filling material 520_5 may form a substantially lattice pattern when viewed from the top. Each cell of the filling pattern 510_5 may be individually disposed for the respective light-exiting area PA. For example, the filling pattern 510_5 may have a substantially island or dot shape when viewed from the top.

Referring to FIG. 24, each cell of a filling pattern 510_6 may be extended in one direction, e.g., in the second direction d2 to be connected to adjacent pixel PX and may be spaced apart from another cell in another direction, e.g., in the first direction d1. For example, the filling pattern 510_6 shown in FIG. 24 may have a linear shape, unlike that shown in FIG. 23.

When there is no concern that the colors of light emitted from different pixels PX are mixed, for example, when the color of light emitted from different pixels PX overlapping each cell of the filling pattern 510_6 is the same, the filling pattern 510_6 may have a shape extended in one direction. As shown in the drawings, when a plurality of pixels PX arranged in the second direction d2 emit light of the same color, there is no concern of color mixture. Accordingly, a single cell of the filling pattern 510_6 may be disposed across them, and it is not necessary to block the path of light by the filling material 520_6 in order to prevent color mixture. Accordingly, the cells of the filling pattern 510_6 may be extended in one direction to overlap with a plurality of pixels PX.

Referring to FIG. 25, a filling pattern 510_7 in FIG. 25 is different from that shown in FIG. 23 in that it has a circular or elliptical shape with a predetermined curvature when viewed from the top. In the following description, the redundant descriptions will not be provided again.

For example, when a filling pattern 510_7 is formed via an inkjet process, the material of the filling pattern 510_7 has surface tension so that the outer surface may have a curvature. Although the filling pattern 510_7 has a circular or elliptical shape when viewed from the top in FIG. 25, this is merely illustrative. The material of the filling pattern 510_7 is not particularly limited herein as long as it can be formed via an inkjet process or another process and at least one surface thereof is formed as a curved surface.

In one or more embodiments, the filling pattern 510 composed of a single cell may be disposed to completely cover the encapsulation layer 170 of the first substrate 100. In other words, the filling pattern 510 may be implemented as a single piece, instead of cells spaced apart from one another. In one or more embodiments, as described above, the filling pattern 510 may include the same material as the encapsulation layer 170. For example, when the encapsulation layer 170 and the filling pattern 510 include hexamethyldisiloxane (HMDSO), the filling pattern 510 may be formed via a continuous process when the encapsulation layer 170 is formed on the common electrode CE of the first substrate 100. That is, the encapsulation layer 170 and the filling pattern 510 may form substantially a single layer.

Figure 26:
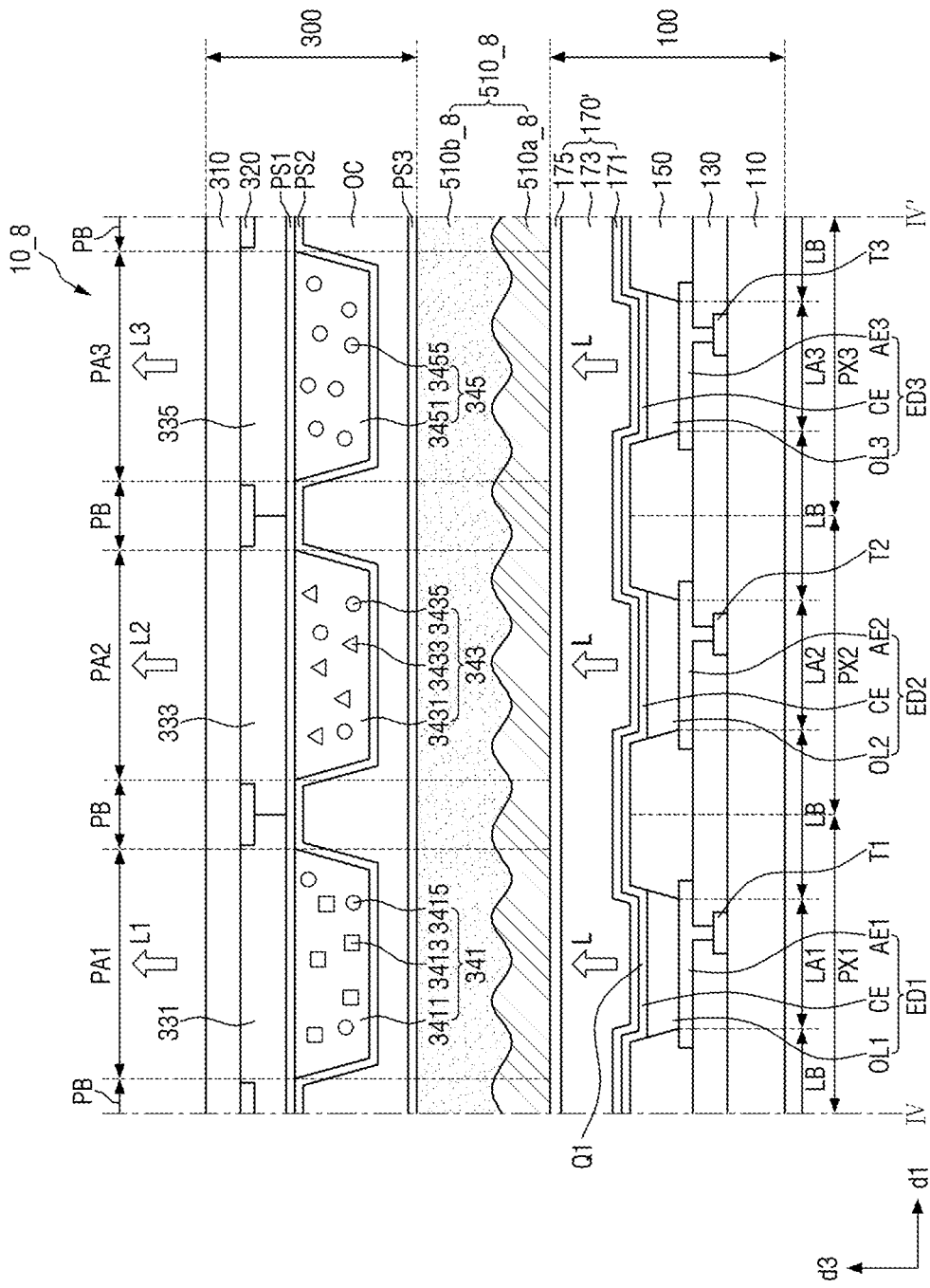
FIGS. 26 and 27 are cross-sectional views of display devices according to other exemplary embodiments of the present disclosure, taken along line IV-IV' of FIG. 3.
Figure 27:
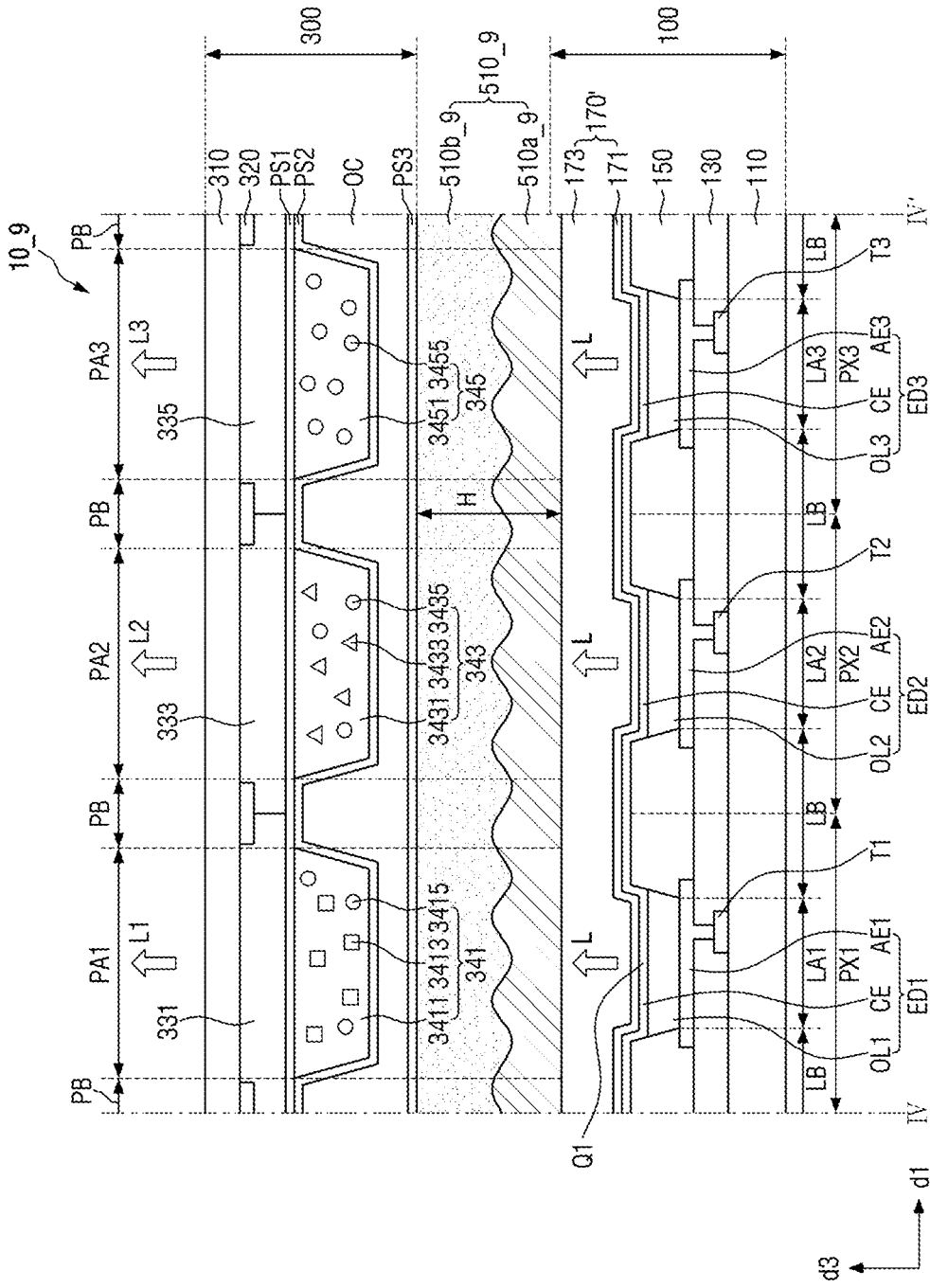

FIGS. 26 and 27 are cross-sectional views of display devices according to other exemplary embodiments of the present disclosure, taken along line IV-IV' of FIG. 3.

Referring to FIG. 26, a filling pattern 510_8 according to an exemplary embodiment of the present disclosure may cover the encapsulation layer 170 entirely. Unlike the display device 10 of FIG. 14, a display device 10_8 according to the exemplary embodiment shown in FIG. 26 can be integrated into a single layer without being patterned into a plurality of cells of the filling patterns 510_8. Accordingly, the filling layer 500 includes the filling pattern 510_8, but may not include the filling material 520. For example, the filling layer 500 may be filled only with the filling pattern 510_8.

In such case, the light L output from the first substrate 100 is scattered at the curve portion GP formed in the first pattern part 510a_8 of the filling pattern 510_8. The scattered light L' may be incident on the second substrate 300 through the second pattern part 510b_8. The light extraction efficiency of the display device 10_8 of FIG. 26 can be increased compared to the display device in which the filling pattern 510 is not disposed in the filling layer 500 but the filling layer 500 is filled only with the filler material 520. In addition, if there is no concern of color mixture among the light-exiting areas PA1, PA2 and PA3, or if the light of the same color exits from the areas, the filling pattern 510_8 of a single cell may be disposed locally as desired. In such case, the first substrate 100 and the second substrate 300 can be attached together reliably without the filling material 520, so that the light extraction efficiency can be improved.

Referring to FIG. 27, in a display device 10_9 according to an exemplary embodiment of the present disclosure, a second inorganic encapsulation layer 175 may not be included in the encapsulation layer 170' of the first substrate 100, and a filling pattern 510_9 may be formed directly on the organic encapsulation layer 173.

As described above, when the encapsulating layer 170 or the organic encapsulation layer 173 and the filling pattern 510 include the same material, for example, hexamethyldisiloxane (HMDSO), the filling pattern 510_9 may be formed directly on the organic encapsulation layer 173 of the encapsulation layer 170. The filling pattern 510_9 may be formed by substantially extending the organic encapsulation layer 173. Although the organic encapsulation layer 173 and the filling pattern 510_9 are shown as being separated from each other in FIG. 27, they may be substantially a single layer.

Accordingly, during the process of fabricating the display device 10_9, the filling pattern 510_9 may be formed via the process of fabricating the first substrate 100, instead of a separate process after the first substrate 100 is fabricated. That is, there is an advantage that the process of fabricating the display device 10_9 can be simplified.

As used herein, the terms "use," "using," and "used" may be considered synonymous with the terms "utilize," "utilizing," and "utilized," respectively.

In addition, the terms "substantially," "about," "approximately," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a first substrate comprising at least one light-emitting element;
   a second substrate facing the first substrate, wherein light emitted from the light-emitting element is to be incident on the second substrate; and
   a filling layer between the first substrate and the second substrate,
   wherein the filling layer comprises a filling pattern comprising a first pattern part on the first substrate, the first pattern part having a curve portion in at least a part thereof, and a second pattern part on the first pattern part, the second pattern part comprising substantially the same material as the first pattern part, and
   the second pattern part covers at least a part of the curve portion, and light emitted from the light-emitting element is to be scattered at the curve portion and is to be incident on the second pattern part.

2. The display device of claim 1, wherein at least a part of the filling pattern overlaps with the light-emitting element, and the light emitted from the light-emitting element is to be incident on the filling pattern.

3. The display device of claim 2, wherein at least a part of the light incident on the filling pattern is to be scattered at the curve portion of the first pattern part.

4. The display device of claim 3, wherein at least a part of the light scattered at the curve portion is to be incident on the second substrate.

5. The display device of claim 4, wherein the curve portion has at least one convex portion protruding upwardly from a straight line extending from one end of the curve portion toward an opposite end thereof, and at least one concave portion protruding downwardly from the straight line, and wherein the convex portion is spaced apart from an adjacent convex portion by about 0.5 to about 1.5 μm.

6. The display device of claim 2, wherein the first pattern part and the second pattern part comprise hexamethyldisiloxane (HMDSO).

7. The display device of claim 6, wherein the curve portion of the first pattern part is formed as the hexamethyldisiloxane reacts with molecules containing nitrogen, and the curve portion comprises the nitrogen.

8. The display device of claim 7, wherein a content of the nitrogen in the first pattern part is larger than a content of the nitrogen in the second pattern part.

9. The display device of claim 2, wherein a bottom surface of the first pattern part of the filling pattern is in contact with at least a part of the first substrate, and a top surface of the second pattern part of the filling pattern is in contact with at least a part of the second substrate.

10. The display device of claim 2, wherein the filling pattern comprises cells, and the cells of the filling pattern are spaced apart from one another, and wherein the filling layer further comprises a filling material between the cells of the filling pattern.

11. The display device of claim 10, wherein a bottom surface of the filling pattern is in contact with the first substrate, and a top surface of the filling pattern is in contact with the second substrate, and wherein the filling material is between the cells of the filling pattern.

12. The display device of claim 11, wherein at least a part of the light incident on the filling pattern is to be incident on an interface between a side surface of the filling pattern and the filling material, and wherein at least a part of the light incident on the interface is to be reflected toward the filling pattern.

13. The display device of claim 10, wherein a bottom surface of the filling pattern is in contact with the first substrate, and a top surface of the filling pattern is spaced apart from the second substrate, and wherein the filling material is between the filling pattern and the second substrate and between the cells of the filling pattern.

14. A display device comprising:
    a first substrate comprising at least one light-emitting element;
    a second substrate facing the first substrate, wherein light emitted from the light-emitting element is to be incident on the second substrate; and
    a filling layer between the first substrate and the second substrate,
    wherein the filling layer comprises a filling pattern comprising a first pattern part on the first substrate, the first pattern part having a curve portion in at least a part thereof,
    wherein the filling pattern comprises cells, and the cells of the filling pattern are spaced apart from one another, wherein the filling layer further comprises a filling material between the cells of the filling pattern, wherein the filling pattern comprises a material having a refractive index higher than a refractive index of the filling material, and wherein a difference between the refractive index of the filling pattern and the refractive index of the filling material is larger than 0.3, and wherein the filling pattern and the filling material comprise an insulating material.

15. The display device of claim 14, wherein the difference between the refractive index of the filling pattern and a refractive index of each of the first substrate and the second substrate ranges from about 0.01 to about 0.3.

16. A display device comprising:
a first base;
at least one organic light-emitting element in each of a plurality of light-emitting areas defined on the first base;
a second base facing the first base, a plurality of light-exiting areas being defined in the second base; and
a filling layer between the organic light-emitting element and the second base, the filling layer comprising a filling pattern composed of cells alternately arranged in one direction when viewed from the top, and a filling material,
wherein the filling pattern comprises a first pattern part at least partially overlapping with the plurality of light-emitting areas and having a curve portion in at least a part thereof, and a second pattern part on the first pattern part and covering the curve portion,
the second pattern part comprises a material that is substantially the same as that of the first pattern part, the material of the second pattern part being different than the filling material, and
a refractive index of the filling material is smaller than a refractive index of the filling pattern.

17. The display device of claim 16, wherein light emitted from the organic light-emitting element is to be incident on the first pattern part of the filling pattern, and the light incident on the first pattern part is to be scattered at the curve portion.

18. The display device of claim 17, wherein at least a part of the light incident on the first pattern part is to be incident on an interface between a side surface of the filling pattern and the filling material, and wherein at least a part of the light incident on the interface is to be reflected toward the first pattern part.

19. The display device of claim 18, wherein at least a part of the light scattered at the curve portion is to be incident on the second pattern part.

20. The display device of claim 19, wherein at least a part of the light incident on the second pattern part is to be incident on an interface between a side surface of the filling pattern and the filling material, and wherein at least a part of the light incident on the interface is to be reflected toward the first pattern part or the second pattern part.

21. The display device of claim 16, further comprising: an encapsulation layer between the organic light-emitting element and the filling layer, wherein the filling pattern is on the encapsulation layer such that a bottom surface of the first pattern part is in contact with the encapsulation layer, and a top surface of the second pattern part faces the second base.

22. The display device of claim 21, wherein the encapsulation layer comprises the same material as the first pattern part and the second pattern part of the filling pattern.

23. The display device of claim 21, wherein a length of a bottom surface of the filling pattern measured in a direction parallel to the first base is substantially equal to a length of a top surface of the filling pattern measured in the direction.

24. The display device of claim 21, wherein an area of a bottom surface of the filling pattern is larger than an area of a top surface thereof when viewed from the top, and wherein a side surface of the filling pattern is inclined such that the side surface and the encapsulation layer form an acute angle.

25. The display device of claim 21, wherein an area of a bottom surface of the filling pattern is smaller than an area of a top surface thereof when viewed from the top, and wherein a side surface of the filling pattern is inclined such that the side surface and the encapsulation layer form an obtuse angle.

26. The display device of claim 16, wherein the filling pattern comprises a first cell of the filling pattern; and a second cell of the filling pattern spaced apart from the first cell in a first direction parallel to the first base, and wherein the filling material is between the first cell and the second cell of the filling pattern.

27. The display device of claim 26, wherein the organic light-emitting element comprises: a first organic light-emitting element; and a second organic light-emitting element spaced apart from the first organic light-emitting element, and wherein the plurality of emitting areas comprises a first emitting area overlapping with the first organic light-emitting element, and a second emitting area overlapping with the second organic light-emitting element.

28. The display device of claim 27, wherein the second base further comprises: a first wavelength conversion pattern between the second base and the first organic light-emitting element; and a second wavelength conversion pattern between the second base and the second organic light-emitting element, and wherein the plurality of light-exiting areas comprises: a first light-exiting area overlapping with the first wavelength conversion pattern; and a second light-exiting area overlapping with the second wavelength conversion pattern.

29. The display device of claim 28, wherein light exiting from the first light-exiting area is to be incident on the first cell of the filling pattern, and at least a part of the incident light is to be scattered at the curve portion to be incident on the first wavelength conversion pattern.

30. The display device of claim 29, wherein at least a part of the light incident on the first cell of the filling pattern is to be incident on an interface between a side surface of the first cell of the filling pattern and the filling material, and wherein at least a part of the light incident on the interface is to be reflected toward the first cell of the filling pattern to be incident on the first wavelength conversion pattern.

31. The display device of claim 30, wherein an area of a bottom surface of the first cell of the filling pattern is larger than an area of the first emitting area, and an area of a top surface of the first cell of the filling pattern is substantially equal to an area of the first light-exiting area.

* * * * *